(12) United States Patent
Benson et al.

(10) Patent No.: US 11,257,766 B1
(45) Date of Patent: Feb. 22, 2022

(54) METHODS OF FORMING MICROELECTRONIC DEVICES, AND RELATED MICROELECTRONIC DEVICES, MEMORY DEVICES, AND ELECTRONIC SYSTEMS

(71) Applicant: Micron Technology, Inc., Boise, ID (US)

(72) Inventors: Russell A. Benson, Boise, ID (US); Davide Colombo, Boise, ID (US); Yan Li, Boise, ID (US); Terrence B. McDaniel, Boise, ID (US); Vinay Nair, Boise, ID (US); Silvia Borsari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/999,817

(22) Filed: Aug. 21, 2020

(51) Int. Cl.
*H01L 23/552* (2006.01)
*H01L 27/108* (2006.01)

(52) U.S. Cl.
CPC ...... *H01L 23/552* (2013.01); *H01L 27/10808* (2013.01); *H01L 27/10847* (2013.01)

(58) Field of Classification Search
CPC ............. H01L 23/552; H01L 27/10808; H01L 27/10847
See application file for complete search history.

(56) References Cited

U.S. PATENT DOCUMENTS

| | | | |
|---|---|---|---|
| 7,166,479 B2 | 1/2007 | Zhu et al. | |
| 7,199,419 B2 | 4/2007 | Haller | |
| 7,247,570 B2 | 7/2007 | Thomas | |
| 7,285,812 B2 | 10/2007 | Tang et al. | |
| 7,442,976 B2 | 10/2008 | Juengling | |
| 7,569,915 B2 | 8/2009 | Spielberger et al. | |
| 7,829,262 B2 | 11/2010 | Tran | |
| 9,099,539 B2 | 8/2015 | Tuttle | |
| 2012/0319201 A1* | 12/2012 | Sun | H01L 29/7827 257/338 |
| 2015/0037937 A1 | 2/2015 | Park et al. | |
| 2015/0123167 A1* | 5/2015 | Ji | H01L 27/0922 257/192 |

FOREIGN PATENT DOCUMENTS

EP          1028431 B1     11/2004

* cited by examiner

*Primary Examiner* — Mohammed R Alam
(74) *Attorney, Agent, or Firm* — TraskBritt

(57) ABSTRACT

A method of forming a microelectronic device comprises forming a conductive shielding material over a conductive shielding structure and a first dielectric structure horizontally adjacent the conductive shielding structure. A second dielectric structure is formed on first dielectric structure and horizontally adjacent the conductive shielding material. The conductive shielding material and the second dielectric structure are patterned to form fin structures extending in parallel in a first horizontal direction. Each of the fin structures comprises two dielectric end structures integral with remaining portions of the second dielectric structure, and an additional conductive shielding structure interposed between the two dielectric end structures in the first horizontal direction. Conductive lines are formed to extend in parallel in the first horizontal direction and to horizontally alternate with the fin structures in a second horizontal direction orthogonal to the first horizontal direction. Microelectronic devices, memory devices, and electronic systems are also described.

28 Claims, 21 Drawing Sheets

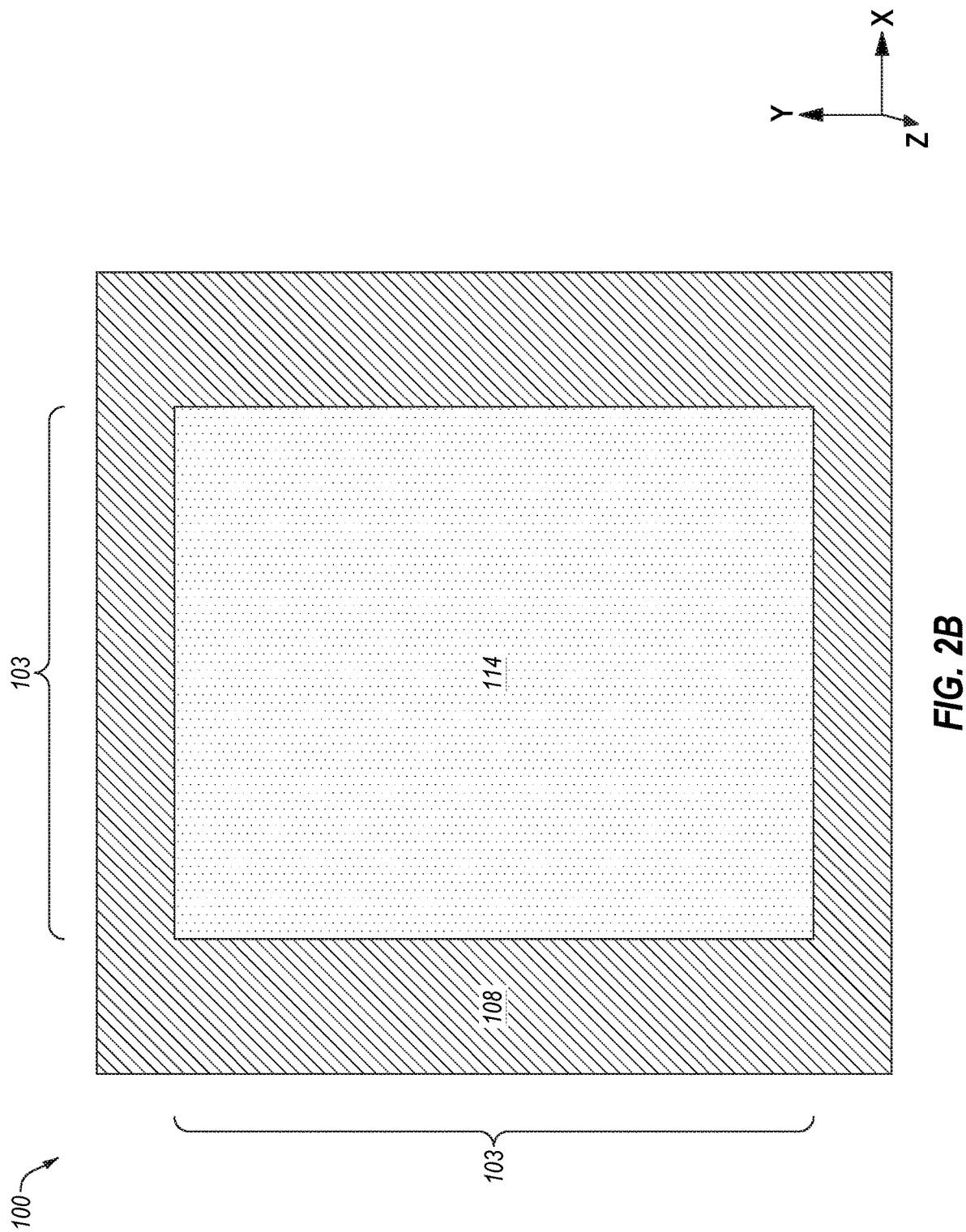

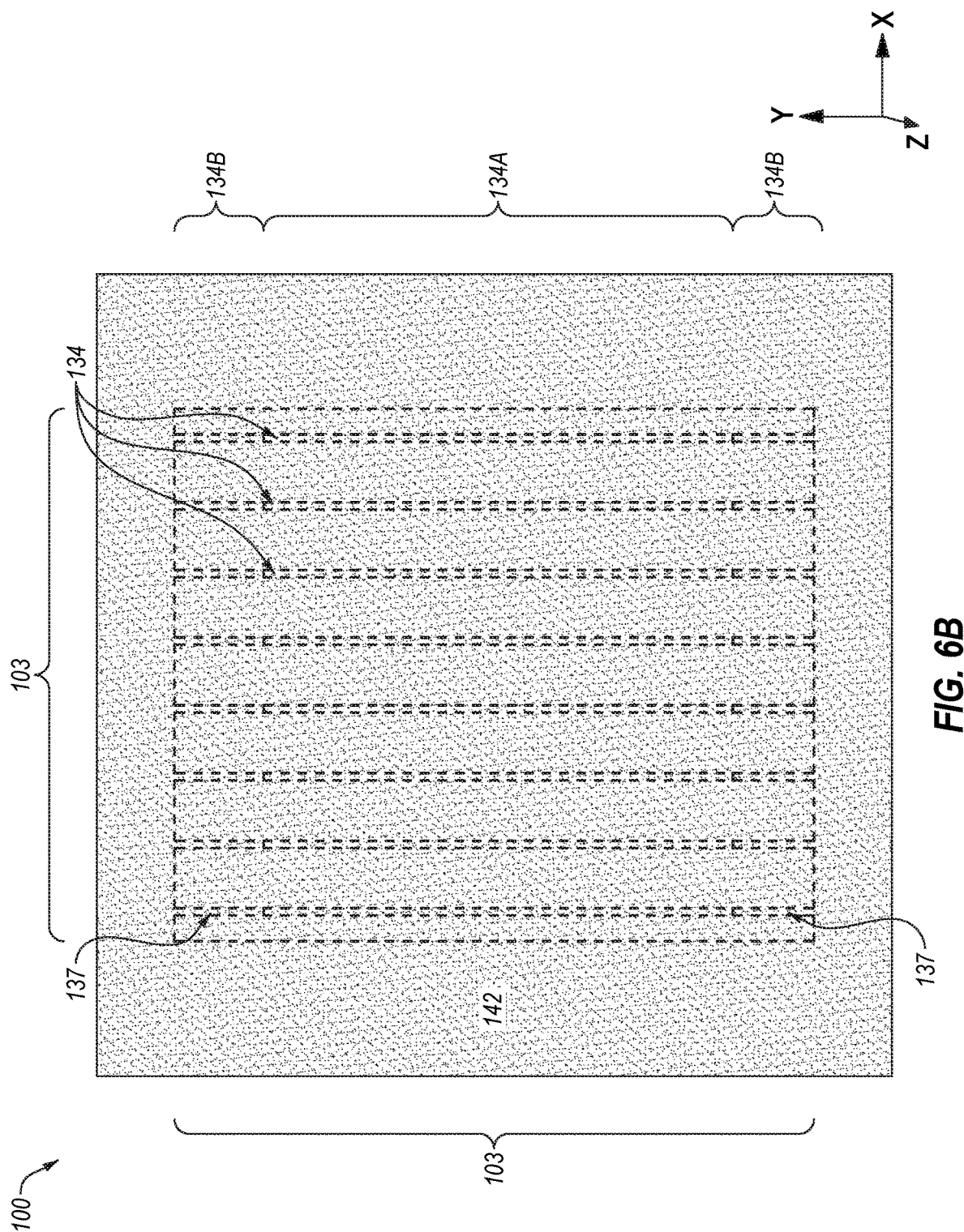

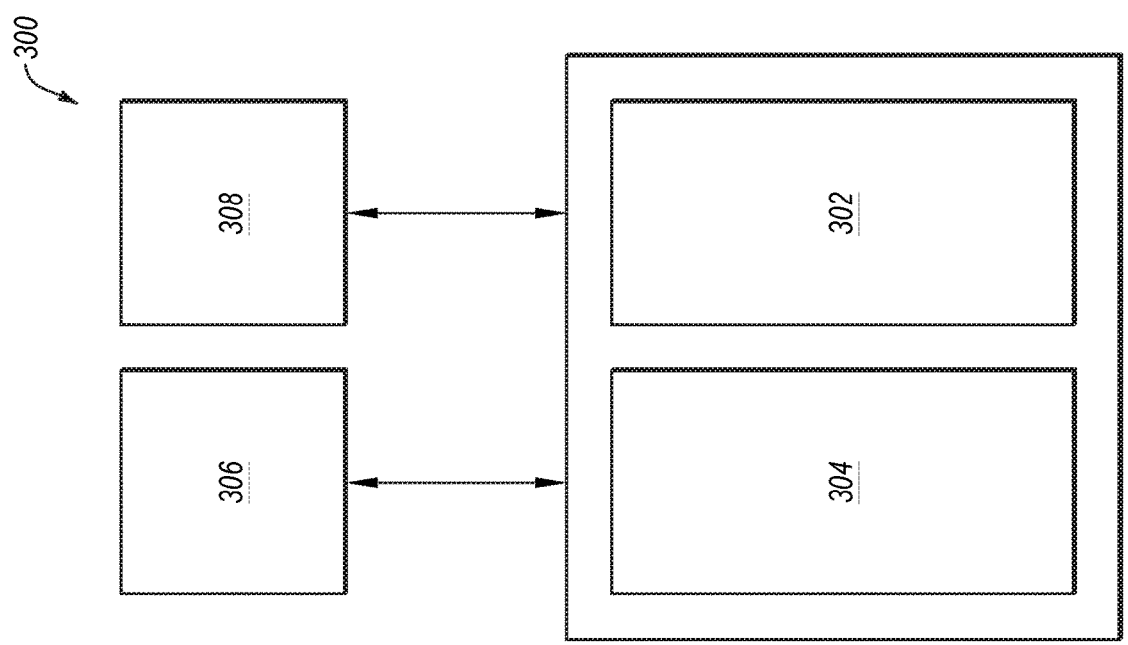

METHODS OF FORMING MICROELECTRONIC DEVICES, AND RELATED MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

A relatively common microelectronic device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

DRAM device manufacturers face significant challenges with reducing DRAM cell area as feature spacing decreases to accommodate increased feature density. The quantities, dimensions, arrangements, and methods of forming of different features employed within the DRAM device can undesirably impede reductions to the size of a DRAM device, increases to the storage density of the DRAM device, and/or reductions in fabrication costs. For example, the configurations and methods of forming conventional shielding structures to protect digit lines of a DRAM device from undesirable electrical interference (e.g., electromagnetic interference, cross-talk) can impede or prevent desirable reductions in the spacing of the digit lines and/or can limit the location of conductive contact structures (e.g., digit line contacts) for the digit lines due to short circuit risks.

BRIEF DESCRIPTION OF THE SEVERAL VIEWS OF THE DRAWINGS

FIG. 11 is a schematic block diagram of an electronic system, in accordance with an embodiment of the disclosure.

DETAILED DESCRIPTION

Figure 1A:
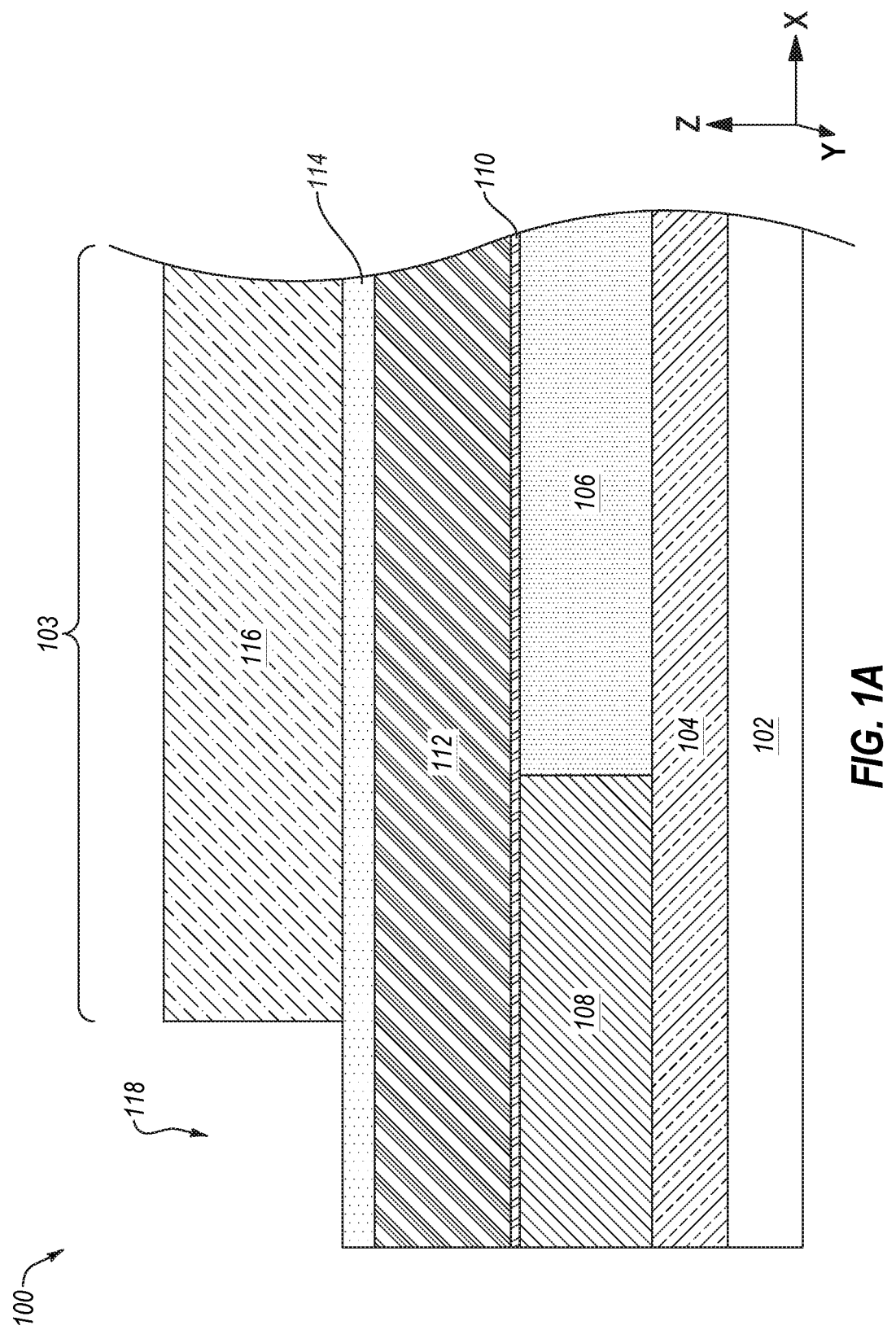
FIGS. 1A through 9B are simplified partial cross-sectional (FIGS. 1A, 2A, 3A, 4A, 5A, 6A, 7A, 8A, 8C, and 9A) and simplified partial top-down (FIGS. 1B, 2B, 3B, 4B, 5B, 6B, 7B, 8B, and 9B) views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as DRAM device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through 9B are simplified partial cross-sectional (FIGS. 1A, 2A, 3A, 4A, 5A, 6A, 7A, 8A, 8C, and 9A) and simplified partial top-down (FIGS. 1B, 2B, 3B, 4B, 5B, 6B, 7B, 8B, and 9B) views illustrating embodiments of a method of forming a microelectronic device structure (e.g., a memory structure) for a microelectronic device (e.g., a memory device, such as a DRAM device). With the description provided below, it will be readily apparent to one of ordinary skill in the art that the methods described herein may be used for forming various devices. In other words, the methods of the disclosure may be used whenever it is desired to form a microelectronic device.

Figure 1B:
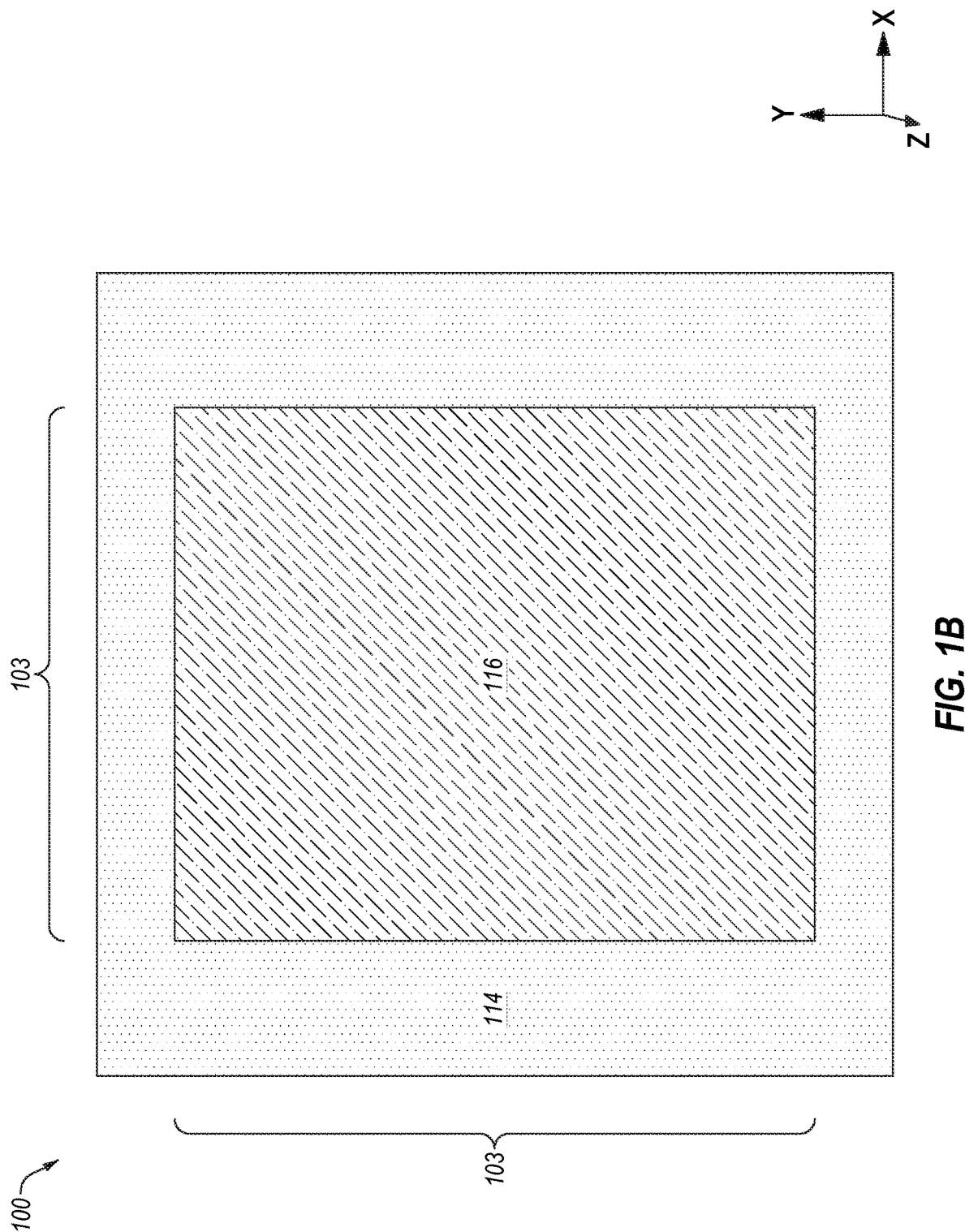

Referring to collectively to FIG. 1A and FIG. 1B (which depicts a simplified partial top-down view of the microelectronic device structure 100 shown in FIG. 1A), a microelectronic device structure 100 may be formed to include a base structure 102; a control logic region 104 on, over, and/or within the base structure 102; a lower shielding structure 106 on or over a portion of the control logic region 104 within horizontal boundaries (e.g., in the X-direction and the Y-direction) of a memory array region 103 of the microelectronic device structure 100; a peripheral dielectric structure 108 on or over another portion the control logic region 104 at least partially outside of the horizontal boundaries of the memory array region 103, and outwardly horizontally neighboring (e.g., in the X-direction and the Y-direction) the lower shielding structure 106; a shielding material 112 on or over the lower shielding structure 106 and the peripheral dielectric structure 108; an optional etch stop structure 110 vertically interposed between the shielding material 112 and each of the lower shielding structure 106 and the peripheral dielectric structure 108; a capping material 114 on or over the shielding material 112; and array masking structure 116 on or over a portion of the capping material 114. The foregoing features of the microelectronic device structure 100, along with additional features (e.g., additional structures, additional materials, additional regions) of the microelectronic device structure 100 at the processing stage depicted in FIGS. 1A and 1B, are described in further detail below.

The base structure 102 comprises a base material or construction upon which additional features (e.g., materials, structures, devices) of the microelectronic device structure 100 are formed. The base structure 102 may comprise a semiconductive structure (e.g., a semiconductive wafer), or a base semiconductive material on a supporting structure. In some embodiments, the base structure 102 comprises a semiconductive wafer. For example, the base structure 102 may be formed of and include one or more of a silicon material, such as monocrystalline silicon and/or polycrystalline silicon (also referred to herein as "polysilicon"); silicon-germanium; germanium; gallium arsenide; a gallium nitride; gallium phosphide; indium phosphide; indium gallium nitride; and aluminum gallium nitride. In some embodiments, the base structure 102 is formed of and includes monocrystalline silicon. The semiconductive base structure may, for example, comprise a monocrystalline silicon wafer. The base structure 102 may include one or more layers, structures, and/or regions formed therein and/or thereon.

The control logic region 104 may include various transistors and conductive routing structures (e.g., conductive line structures, conductive contact structures) that together form control logic circuitry for various control logic devices of the microelectronic device structure 100. In some embodiments, the control logic devices of the control logic region 104 comprise complementary metal oxide semiconductor (CMOS) circuitry. The control logic devices of the control logic region 104 may be configured to control various operations of additional features (e.g., arrays of memory cells) to subsequently be formed within the memory array region 103 of the microelectronic device structure 100, as described in further detail below. As a non-limiting example, the control logic devices of the control logic region 104 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, string drivers, page buffers, and various chip/deck control circuitry. As another non-limiting example, the control logic devices of the control logic region 104 may include devices configured to control column operations for arrays (e.g., storage node structure array(s), access device array(s)) to be formed within the memory array region 103 of the microelectronic device structure 100, such as one or more (e.g., each) of decoders (e.g., local deck decoders, column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices. As a further non-limiting example, the control logic devices of the control logic region 104 may include devices configured to control row operations for arrays (e.g., storage node structure array(s), access device array(s)) to be formed within the memory array region 103 of the microelectronic device structure 100, such as one or more (e.g., each) of decoders (e.g., local deck decoders, row decoders), drivers (e.g., access line drivers, word line (WL) drivers), repair circuitry (e.g., row repair circuitry), memory test devices, MUX, ECC devices, and self-refresh/wear leveling devices. Portions (e.g., portions of transistors, such as source regions, drain regions, and channel regions of the transistors) of the control logic devices of the control logic region 104 may at least partially extend into the base structure 102.

The lower shielding structure 106 (e.g., lower shielding plate, bottom shielding plate) may be configured and positioned to shield (e.g., protect) features (e.g., structures, materials, devices) to be formed within the memory array region 103 of the microelectronic device structure 100 from undesirable electrical interference (e.g., electromagnetic interference (EMI)). The lower shielding structure 106 may be formed of and include conductive material. In some embodiments, the lower shielding structure 106 is formed of and includes metallic material, such as one or more of at least one metal, at least one alloy, and at least one conductive metal-containing material (e.g., a conductive metal nitride, a conductive metal silicide, a conductive metal carbide, a conductive metal oxide). By way of non-limiting example, the lower shielding structure 106 may be formed of and include tungsten (W). The lower shielding structure 106 may be substantially homogeneous, or the lower shielding structure 106 may be heterogeneous. As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If the lower shielding structure 106 is heterogeneous, amounts of one or more elements included in the lower shielding structure 106 may vary stepwise (e.g., change abruptly), or may vary continuously (e.g., change progressively, such as linearly, parabolically) throughout different portions of the lower shielding structure 106. The lower shielding structure 106 may, for example, be formed of and include a stack of at least two different conductive materials.

The peripheral dielectric structure 108 may be horizontally positioned proximate (e.g., close to, near, directly adjacent) outer horizontal boundaries (e.g., peripheral horizontal boundaries) of the base structure 102. The peripheral dielectric structure 108 may horizontally circumscribe the lower shielding structure 106. The peripheral dielectric structure 108 may also horizontally circumscribe the memory array region 103 of the microelectronic device structure 100. As shown in FIGS. 1A and 1B, portions (e.g., horizontally inner portions) of the peripheral dielectric structure 108 may horizontally extend into the memory array region 103 of the microelectronic device structure 100. The peripheral dielectric structure 108 may be positioned directly horizontally adjacent the lower shielding structure 106. In addition, an upper vertical boundary (e.g., an upper surface) of the peripheral dielectric structure 108 may be substantially coplanar with an upper vertical boundary (e.g., an upper surface) of the lower shielding structure 106.

The peripheral dielectric structure 108 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the peripheral dielectric structure 108 is formed of and includes at least one dielectric oxide material (e.g., $SiO_x$, such as silicon dioxide ($SiO_2$)). The peripheral dielectric structure 108 may be substantially homogeneous, or the peripheral dielectric structure 108 may be heterogeneous. If the peripheral dielectric structure 108 is heterogeneous, amounts of one or more elements included in the peripheral dielectric structure 108 may vary stepwise (e.g., change abruptly), or may vary continuously (e.g., change progressively, such as linearly, parabolically) throughout different portions of the peripheral dielectric structure 108. The peripheral dielectric structure 108 may, for example, be formed of and include a stack of at least two different dielectric materials.

The shielding material 112 may overlie (e.g., in the Z-direction) upper vertical boundaries (e.g., upper surfaces) of the lower shielding structure 106 and the peripheral dielectric structure 108. The shielding material 112 may be employed to form shielding structures of subsequently formed fin structures, as described in further detail below. The shielding material 112 may be formed to substantially continuously horizontally extend across the lower shielding structure 106 and the peripheral dielectric structure 108. An upper vertical boundary and a lower vertical boundary of the shielding material 112 may each individually be substantially planar.

The shielding material 112 may be formed of and include conductive material. In some embodiments, the lower shielding structure 106 is formed of and includes metallic material, such as one or more of at least one metal, at least one alloy, and at least one conductive metal-containing material (e.g., a conductive metal nitride, a conductive metal silicide, a conductive metal carbide, a conductive metal oxide). A material composition of the shielding material 112 may be substantially the same as a material composition of the lower shielding structure 106, or the material composition of the shielding material 112 may be different than the material composition of the lower shielding structure 106. In some embodiments, the shielding material 112 is formed of and includes W. The shielding material 112 may be substantially homogeneous, or the shielding material 112 may be heterogeneous. If the shielding material 112 is heterogeneous, amounts of one or more elements included in the shielding material 112 may vary stepwise (e.g., change abruptly), or may vary continuously (e.g., change progressively, such as linearly, parabolically) throughout different portions of the shielding material 112. The shielding material 112 may, for example, be formed of and include a stack of at least two different conductive materials.

Optionally, the etch stop structure 110 may be formed vertically over the lower shielding structure 106 and the peripheral dielectric structure 108 and vertical under the shielding material 112. The etch stop structure 110 may, for example, be employed to mitigate over-etching into the lower shielding structure 106 and the peripheral dielectric structure 108 during subsequent patterning of the shielding material 112, as described in further detail below. If formed, the etch stop structure 110 may substantially continuously horizontally extend across the lower shielding structure 106 and the peripheral dielectric structure 108. In addition, an upper vertical boundary and a lower vertical boundary of the etch stop structure 110 (if formed) may each individually be substantially planar.

If formed, the etch stop structure 110 may comprise conductive material. In some embodiments, the lower shielding structure 106 is formed of and includes metallic material, such as one or more of at least one metal, at least one alloy, and at least one conductive metal-containing material (e.g., a conductive metal nitride, a conductive metal silicide, a conductive metal carbide, a conductive metal oxide). A material composition of the etch stop structure 110 may be different than material compositions of the shielding material 112 and the lower shielding structure 106. In some embodiments, the etch stop structure 110 is formed of and includes a conductive metal nitride, such as one or more of titanium nitride ($TiN_x$) and tungsten nitride ($WN_x$). The etch stop structure 110 may be substantially homogeneous, or the lower shielding structure 106 may be heterogeneous. If the etch stop structure 110 is formed and is heterogeneous, amounts of one or more elements included in the etch stop structure 110 may vary stepwise (e.g., change abruptly), or may vary continuously (e.g., change progressively, such as linearly, parabolically) throughout different portions of the etch stop structure 110. The etch stop structure 110 may, for example, be formed of and include a stack of at least two different conductive materials.

The capping material 114 may vertically overlie upper vertical boundaries (e.g., upper surfaces) of the shielding material 112. The capping material 114 may be employed to subsequently form capping structures of subsequently formed fin structures, as described in further detail below. The capping material 114 may be formed to substantially continuously horizontally extend across the shielding material 112. An upper vertical boundary and a lower vertical boundary of the capping material 114 may each individually be substantially planar.

The capping material 114 may be formed of and include insulative material. By way of non-limiting example, the capping material 114 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the capping material 114 is formed of and includes at least one dielectric nitride material (e.g., $SiN_y$, such as $Si_3N_4$). The capping material 114 may be substantially homogeneous, or the capping material 114 may be heterogeneous. If the capping material 114 is heterogeneous, amounts of one or more elements included in the peripheral dielectric structure 108 may vary stepwise (e.g., change abruptly), or may vary continuously (e.g., change progressively, such as linearly, parabolically) throughout different portions of the capping material 114. The capping material 114 may, for example, be formed of and include a stack of at least two different dielectric materials.

The array masking structure 116 may cover a portion of the capping material 114 within horizontal boundaries (e.g., in the X-direction and the Y-direction) of the memory array region 103 of the microelectronic device structure 100. The array masking structure 116 may also horizontally extend into, but only partially cover, additional portions of the capping material 114 outside of the horizontal boundaries of the memory array region 103 (e.g., portions of the capping material 114 within horizontal boundaries of the peripheral dielectric structure 108). As shown in FIG. 1A, further portions of the capping material 114 may remain exposed (e.g., uncovered) under an opening 118 (e.g., trench) positioned horizontal adjacent to horizontal boundaries (e.g., in the X-direction and the Y-direction) of the array masking structure 116. Horizontal dimensions (e.g., in the X-direction and the Y-direction) of the opening 118 (and, hence, the exposed portions of the capping material 114) may correspond to desirable horizontal dimensions of one or more additional structures (e.g., an additional peripheral dielectric structure) to be subsequently formed to vertically extend through at least the capping material 114 and the shielding material 112, as described in further detail below.

The array masking structure 116 may serve as a mask to protect portions of the capping material 114 and the shielding material 112 vertically thereunder and within horizontal boundaries thereof from removal during subsequent processing, as described in further detail below. The array masking structure 116 may, for example, comprise one or more of a hard mask structure and a photoresist structure. By way of non-limiting example, the array masking structure 116 may be formed of and include one or more (e.g., a stack) of amorphous carbon (e.g., spin-on carbon (SOC)), silicon (e.g., polysilicon), a dielectric material (e.g., one or more dielectric oxide material, dielectric nitride material, dielectric oxycarbide material, a hydrogenated dielectric oxycarbide material, and a dielectric carboxynitride material), and a photoresist material (e.g., a positive tone photoresist material, a negative tone photoresist material).

Figure 2A:
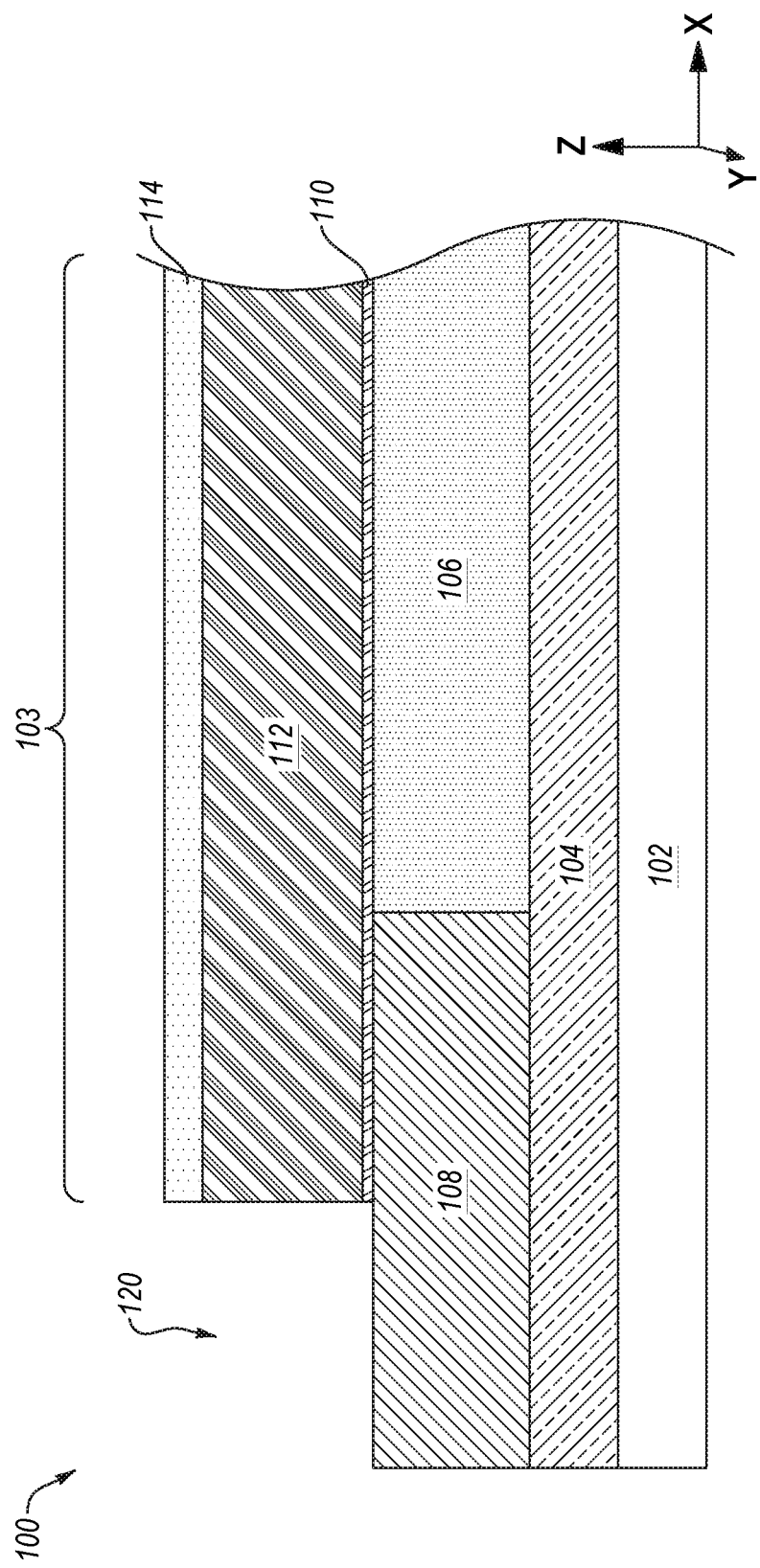

Next, referring collectively to FIG. 2A and FIG. 2B (which depicts a simplified partial top-down view of the microelectronic device structure 100 at the processing stage shown in FIG. 2A), the microelectronic device structure 100 may be subjected to at least one material removal process to remove portions of at least the capping material 114 and the shielding material 112 not protected by (e.g., outside of horizontal boundaries of) the array masking structure 116 (FIGS. 1A and 1B) and form a recess 120 vertically extending (e.g., in the Z-direction) completely through the capping material 114 and the shielding material 112. As shown in FIG. 2A, in embodiments wherein the etch stop structure 110 is formed, the material removal process may also remove portions of the etch stop structure 110 not protected by the array masking structure 116 (FIGS. 1A and 1B). The recess 120 may vertically extend to and expose the peripheral dielectric structure 108. In addition, as shown in FIGS. 2A and 2B, the material removal process may substantially remove the array masking structure 116 (FIGS. 1A and 1B) and expose (e.g., uncover) remaining (e.g., unremoved) portions of the capping material 114.

Figure 3A:
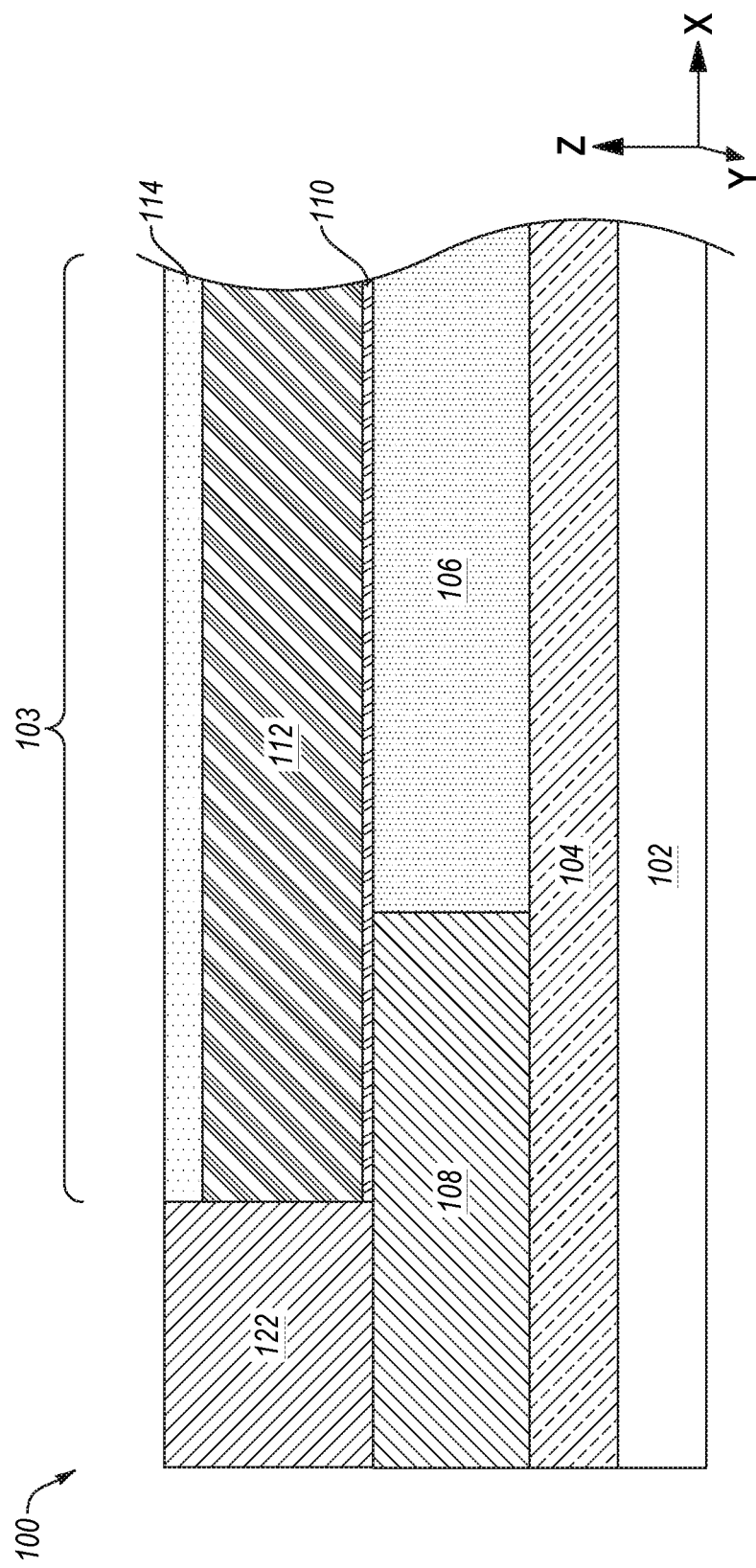
Figure 3B:
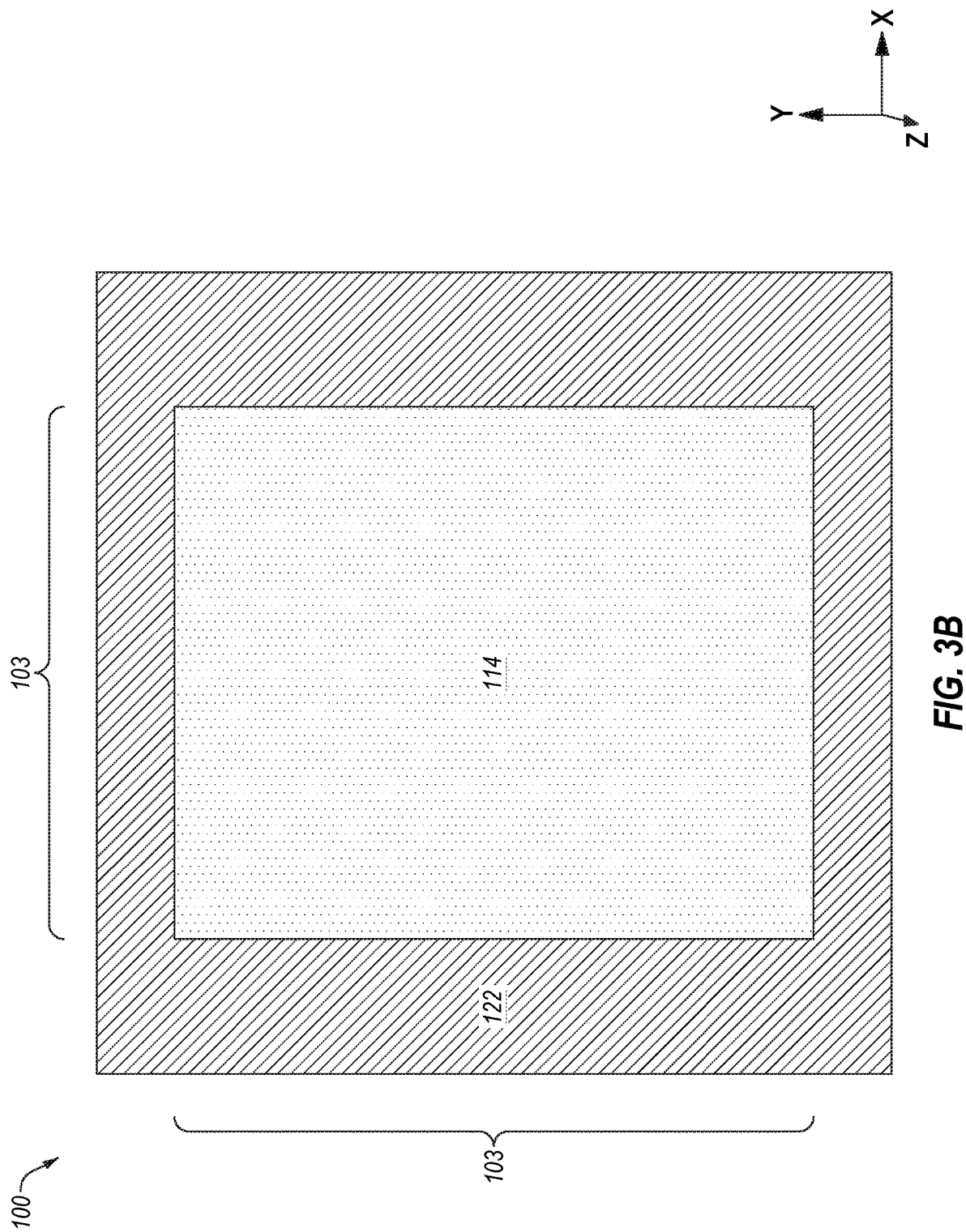

Collectively referring to FIG. 3A and FIG. 3B (which depicts a simplified partial top-down view of the microelectronic device structure 100 at the processing stage shown in FIG. 3A), an additional peripheral dielectric structure 122 may be formed within the recess 120 (FIG. 2A) vertically extending through at least the capping material 114 and the shielding material 112. The additional peripheral dielectric structure 122 may be substantially confined within boundaries (e.g., horizontal boundaries, vertical boundaries) of the recess 120 (FIG. 2), and may substantially fill the recess 120 (FIG. 2A). Accordingly, the additional peripheral dielectric structure 122 may be horizontally positioned proximate (e.g., close to, near, directly adjacent) outer horizontal boundaries of the base structure 102, and may have relatively smaller dimensions in one or more horizontal directions (e.g., in the X-direction) than the peripheral dielectric structure 108. Inner horizontal boundaries of the additional peripheral dielectric structure 122 may be outwardly horizontally offset from inner horizontal boundaries of the peripheral dielectric structure 108. As shown in FIG. 3A, the additional peripheral dielectric structure 122 may physically contact an upper surface of the peripheral dielectric structure 108. The additional peripheral dielectric structure 122 may also physically contact side surfaces of remaining portions of the capping material 114 and the shielding material 112. In embodiments wherein the etch stop structure 110 is formed, the additional peripheral dielectric structure 122 may also physically contact side surfaces of remaining portions of the etch stop structure 110. An upper boundary (e.g., upper surface) of the additional peripheral dielectric structure 122 may be formed to be substantially coplanar with an upper boundary (e.g., an upper surface) of the remaining portion of the capping material 114.

The additional peripheral dielectric structure 122 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). A material composition of the additional peripheral dielectric structure 122 may be substantially the same as a material composition of the peripheral dielectric structure 108, or the material composition of the additional peripheral dielectric structure 122 may be different than the material composition of the peripheral dielectric structure 108. In some embodiments, the additional peripheral dielectric structure 122 is formed of and includes at least one dielectric oxide material (e.g., $SiO_x$, such as Sift). The additional peripheral dielectric structure 122 may be substantially homogeneous, or the additional peripheral dielectric structure 122 may be heterogeneous. If the additional peripheral dielectric structure 122 is heterogeneous, amounts of one or more elements included in the additional peripheral dielectric structure 122 may vary stepwise (e.g., change abruptly), or may vary continuously (e.g., change progressively, such as linearly, parabolically) throughout different portions of the additional peripheral dielectric structure 122. The additional peripheral dielectric structure 122 may, for example, be formed of and include a stack of at least two different dielectric materials.

Figure 4A:
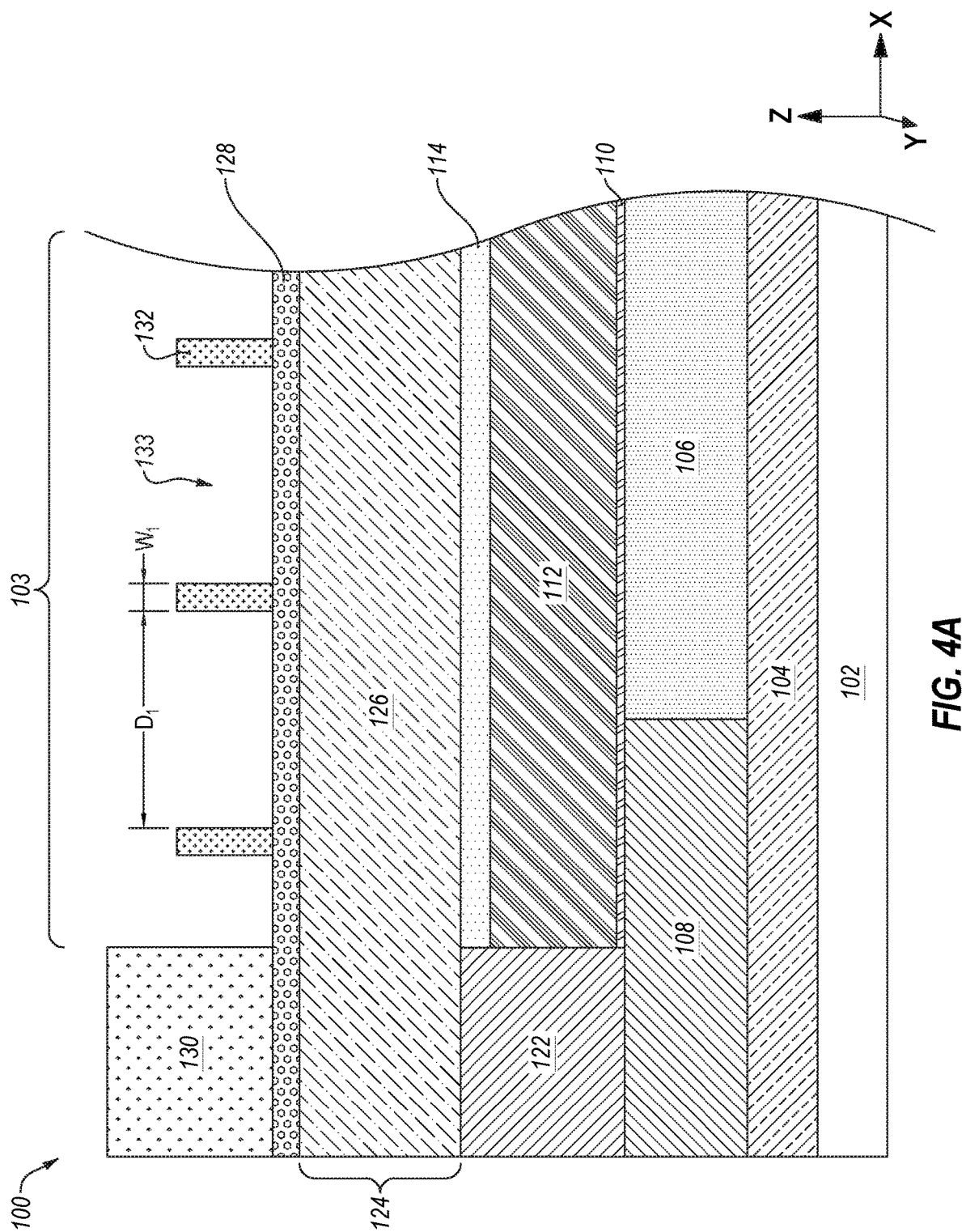
Figure 4B:
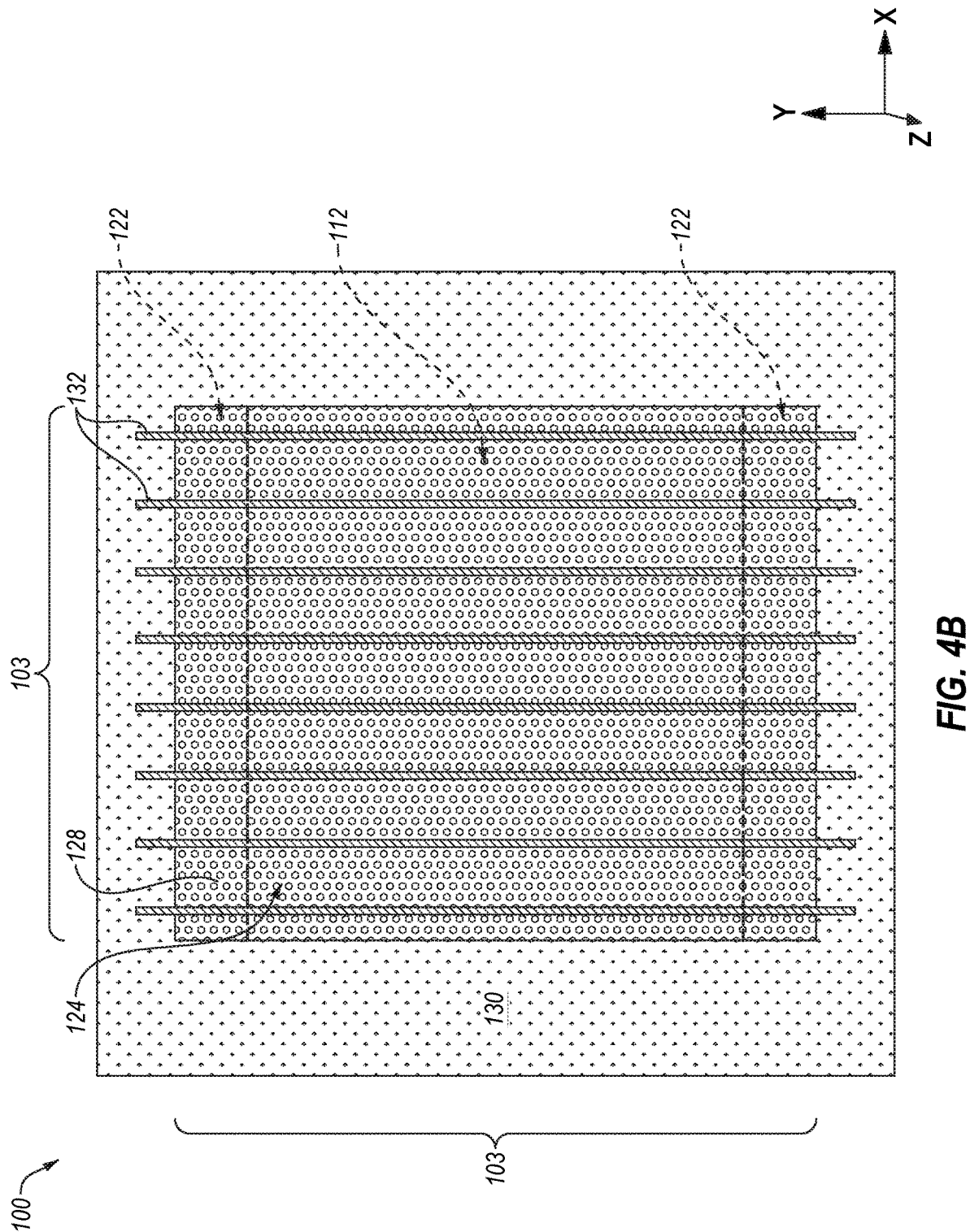

Next, referring collectively to FIG. 4A and FIG. 4B (which depicts a simplified partial top-down view of the microelectronic device structure 100 at the processing stage shown in FIG. 4A), an additional masking structure 124 may be formed on or over the additional peripheral dielectric structure 122 and the capping material 114; spacer structures 132 may be formed on or over portions of the additional masking structure 124 within horizontal boundaries of the memory array region 103; and a peripheral masking structure 130 may formed on or over additional portions of the additional masking structure 124 outside of the horizontal boundaries of the memory array region 103. As shown in FIG. 4A, trenches 133 (e.g., openings, apertures) may be formed to horizontally intervene between (e.g., in the X-direction) and separate horizontally neighboring spacer structures 132.

As described in further detail below, the additional masking structure 124 may be employed to transfer a pattern formed by the spacer structures 132 and the peripheral masking structure 130 into the capping material 114, the shielding material 112, and the additional peripheral dielectric structure 122 to form fin structures. The additional masking structure 124 may be formed of and include at least one material facilitating the aforementioned transfer of the pattern formed by the spacer structures 132 and the peripheral masking structure 130, and that may be readily removed relative to the capping material 114, the shielding material 112, and the additional peripheral dielectric structure 122. By way of non-limiting example, the additional masking structure 124 may be formed of and include one or more of amorphous carbon, silicon (e.g., polysilicon), a dielectric material (e.g., one or more of dielectric oxide material, dielectric nitride material, dielectric oxycarbide material, hydrogenated dielectric oxycarbide material, and a dielectric carboxynitride material), and a photoresist material (e.g., a positive tone photoresist material, a negative tone photoresist material). The additional masking structure 124 may be substantially homogeneous, or the additional masking structure 124 may be heterogeneous. If the additional masking structure 124 is heterogeneous, amounts of one or more elements included in the additional masking structure 124 may vary stepwise (e.g., change abruptly), or may vary continuously (e.g., change progressively, such as linearly, parabolically) throughout different portions of the additional masking structure 124. The additional masking structure 124 may, for example, be formed of and include a stack of at least two different materials.

As shown in FIG. 4A, in some embodiments, the additional masking structure 124 comprises a stack structure including a first masking material 126 and a second masking material 128 on or over the first masking material 126. The first masking material 126 may, for example, comprise amorphous carbon (e.g., SOC); and the second masking material 128 may, for example, comprise at least one different material, such as one or more of silicon (e.g., polysilicon) and dielectric material (e.g., one or more of dielectric oxide material, dielectric nitride material, dielectric oxycarbide material, hydrogenated dielectric oxycarbide material, and a dielectric carboxynitride material).

The spacer structures 132 may be formed to have horizontal dimensions (e.g., in the X-direction and in the Y-direction) and horizontal spacing (e.g., in the X-direction) corresponding to (e.g., substantially the same as) desirable horizontal dimensions and horizontal spacing of fin structures to be formed from the capping material 114, the shielding material 112, and the additional peripheral dielectric structure 122 through subsequent processing acts, as described in further detail below. The spacer structures 132 may be formed to have horizontally elongate shapes extending in parallel in the Y-direction, and separated from one another in the X-direction by the trenches 133. The trenches 133 may vertically extend in the Z-direction completely through the spacer structures 132 to expose portions of an upper surface of the additional masking structure 124. The spacer structures 132 may be positioned outside of horizontal boundaries of the additional peripheral dielectric structure 122 in the X-direction, and may horizontally extend into horizontal boundaries of the additional peripheral dielectric structure 122 in the Y-direction.

As shown in FIG. 4A, the spacer structures 132 may individually exhibit a width $W_1$ in the X-direction, may be separated (e.g., spaced) from one or more other, horizontally neighboring spacer structures 132 by a distance $D_1$ in the X-direction. In some embodiments, the width $W_1$ of an individual spacer structure 132 is within a range of from about 6 nanometers (nm) to about 10 nm; and the distance $D_1$ between spacer structures 132 horizontally neighboring one another (and, hence, a width in the X-direction of an individual trench 133) is within a range of from about 30 nm to about 50 nm. The spacer structures 132 may each be formed to have substantially the same width $W_1$ and substantially the same distance $D_1$ from other, horizontally neighboring spacer structures 132; or at least one of the spacer structures 132 may be formed to have a different width $W_1$ and/or a different distance $D_1$ from other, horizontally neighboring spacer structures 132 than at least one other of the spacer structures 132.

Still referring collectively to FIG. 4A and FIG. 4B, in the Y-direction, a portion (e.g., a central portion) of each individual spacer structure 132 may be located within horizontal boundaries (depicted in FIG. 4B by way of dashed lines) of the shielding material 112 (FIG. 4A) underlying the additional masking structure 124. In addition, further portions (e.g., opposing end portions) of each individual spacer structure 132 may extend beyond the horizontal boundaries of the shielding material 112 (FIG. 4A) and into the horizontal boundaries (also depicted in FIG. 4B by way of dashed lines) in the Y-direction of the additional peripheral dielectric structure 122. As shown in FIG. 4B, the further portions of each individual spacer structure 132 may horizontally extend into horizontal boundaries in the Y-direction of the peripheral masking structure 130.

The peripheral masking structure 130 may be configured and positioned to protect portions of the additional masking structure 124 and the spacer structures 132 from removal during subsequent processing acts to form fin structures, as described in further detail below. As show in FIG. 4B, in the Y-direction, the peripheral masking structure 130 may only partially (e.g., less than completely) cover the additional peripheral dielectric structure 122. For example, portions of the additional peripheral dielectric structure 122 proximate to the shielding material 112 in the Y-direction may remain uncovered by the peripheral masking structure 130, while other portions of the additional peripheral dielectric structure 122 relatively more distal from the shielding material 112 in the Y-direction may be covered by the peripheral masking structure 130. In addition, further portions of the additional peripheral dielectric structure 122 adjacent to the shielding material 112 in the X-direction may be substantially covered by the peripheral masking structure 130.

The peripheral masking structure 130 may be formed of and include at least one material facilitating desirable patterning of the additional masking structure 124 (and, hence, desirable patterning of the shielding material 112, the capping material 114, and the additional peripheral dielectric structure 122) using the spacer structures 132 and the peripheral masking structure 130. By way of non-limiting example, the peripheral masking structure 130 may be formed of and include photoresist material (e.g., positive tone photoresist material, negative tone photoresist material). The peripheral masking structure 130 may be substantially homogeneous, or the peripheral masking structure 130 may be heterogeneous. If the peripheral masking structure 130 is heterogeneous, amounts of one or more elements included in the peripheral masking structure 130 may vary stepwise (e.g., change abruptly), or may vary continuously (e.g., change progressively, such as linearly, parabolically) throughout different portions of the peripheral masking structure 130. The peripheral masking structure 130 may, for example, be formed of and include a stack of at least two different materials (e.g., at least two different photoresist materials).

Figure 5A:
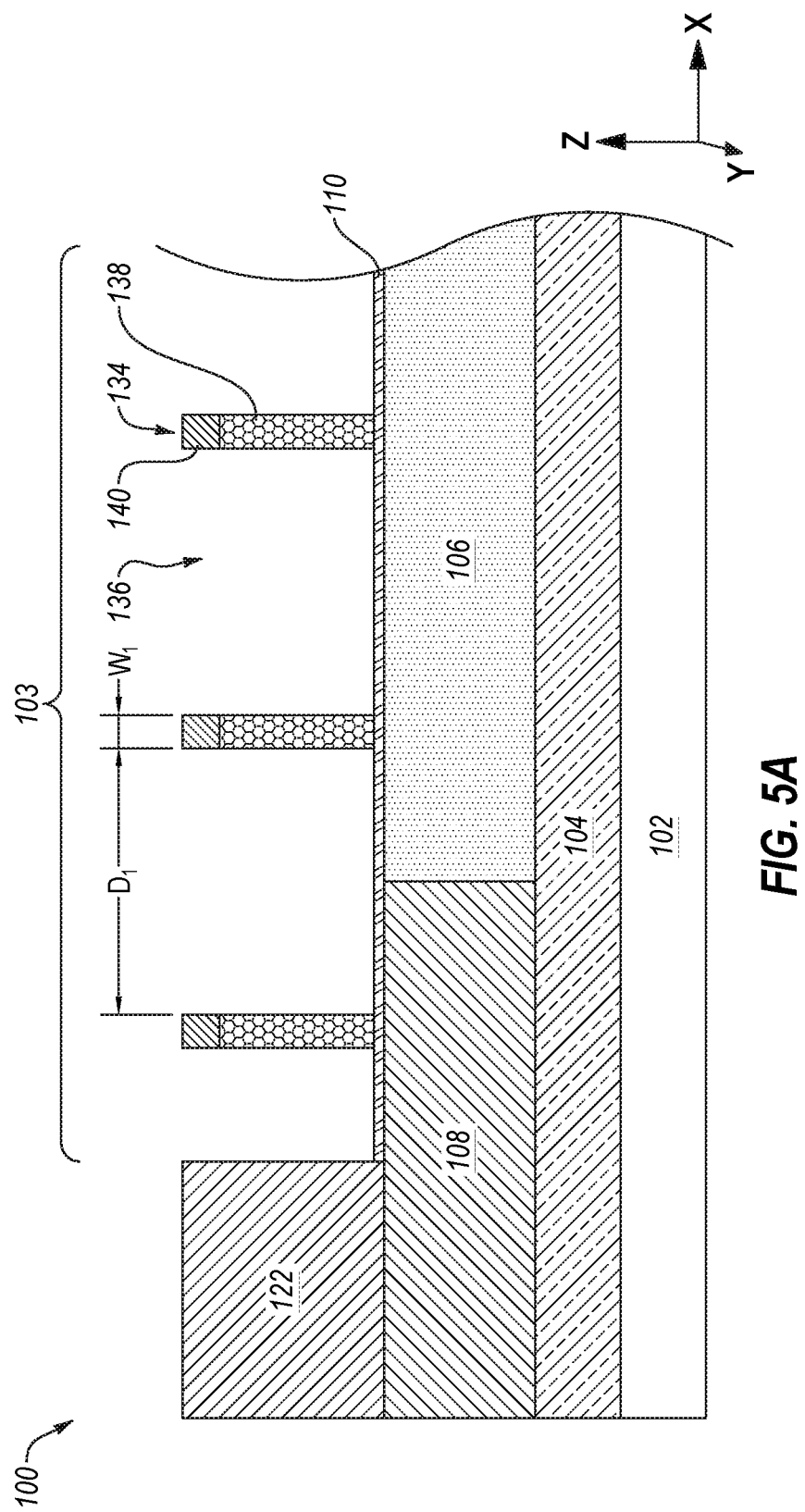
Figure 5B:
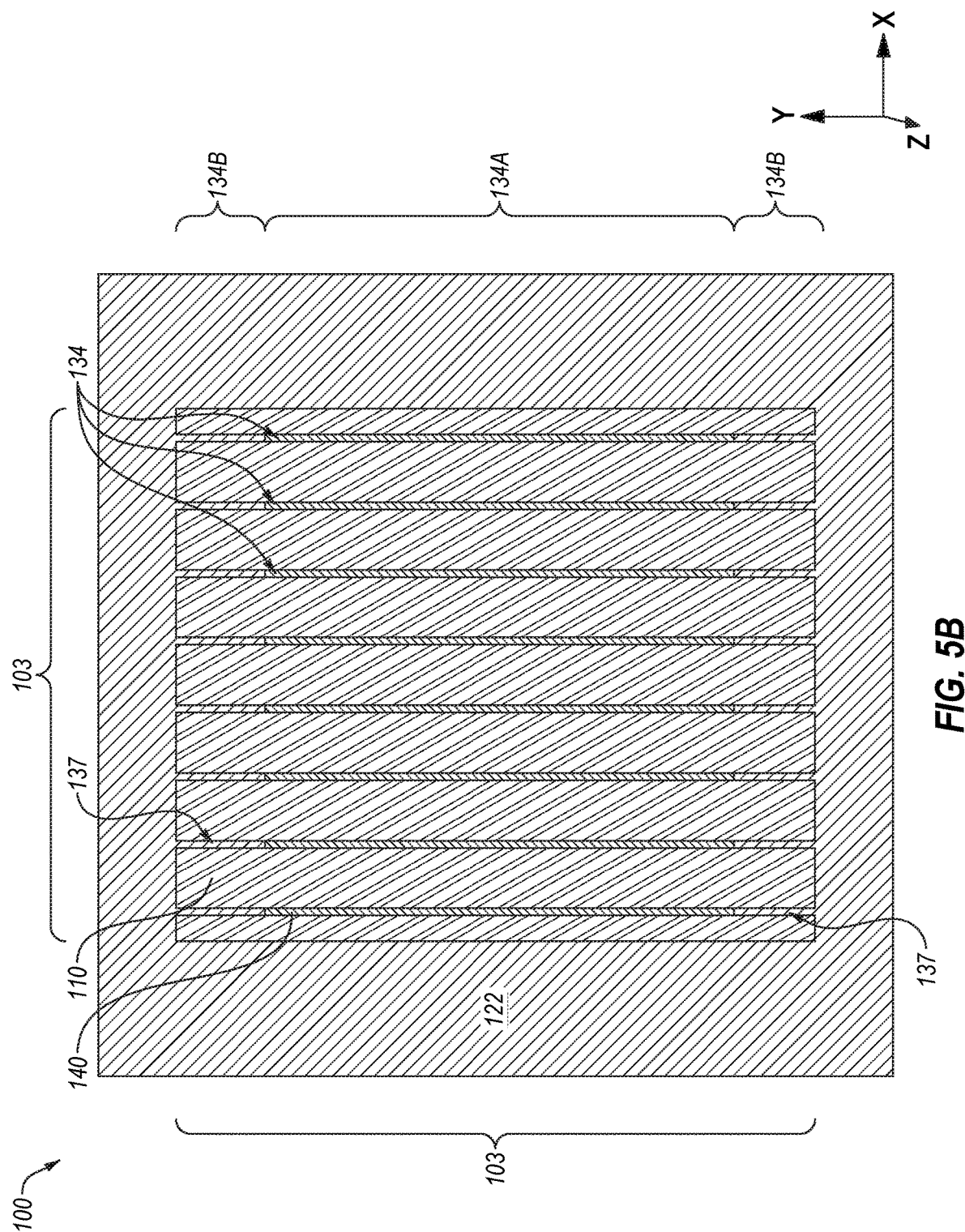

Next, referring collectively to FIG. 5A and FIG. 5B (which depicts a simplified partial top-down view of the microelectronic device structure 100 at the processing stage shown in FIG. 4A), a pattern defined by areas of the microelectronic device structure 100 remaining unprotected by at least one of the peripheral masking structure 130 (FIGS. 4A and 4B) and the spacer structures 132 (FIGS. 4A and 4B) may be transferred into the shielding material 112, the capping material 114, and portions of the additional peripheral dielectric structure 122 to form fin structures 134 separated from one another by additional trenches 136. As shown in FIG. 4B, each of the fin structures 134 individually include a central region 134A and opposing end regions 134B horizontally adjacent (e.g., in the Y-direction) to the central region 134A. The central region 134A of each fin structure 134 may be horizontally interposed (e.g., in the Y-direction) between the opposing end regions 134B of the fin structure 134. The central regions 134A of the fin structures 134 may include additional shielding structures 138 (FIG. 5A) formed from the shielding material 112 (FIG. 4A); and capping structures 140 (FIGS. 5A and 5B) overlying the additional shielding structures 138 and formed from the capping material 114 (FIG. 4A). The opposing end regions 134B of the fin structures 134 may include dielectric end structures 137 (FIG. 5B) comprising remaining (e.g., unremoved) portions of the additional peripheral dielectric structure 122 horizontally projecting (e.g., in the Y-direction) from and integral with other remaining portions of the additional peripheral dielectric structure 122. The dielectric end structures 137 of an individual fin structure 134 may be positioned directly horizontally adjacent (e.g., in the Y-direction) the additional shielding structures 138 and the capping structures 140 of the fin structure 134.

The additional shielding structures 138 of the fin structures 134 may be employed to protect (e.g., shield) conductive lines (e.g., digit lines, bit lines, data line structure) to be sequential by formed within the additional trenches 136 from electrical interference (e.g., cross-talk, other generated noise) with one another and/or other features (e.g., structures, materials, devices) of the microelectronic device structure 100. The additional shielding structures 138 may be formed to have horizontally elongate shapes extending in parallel in the Y-direction, and may be separated from one another in the X-direction by the additional trenches 136. As shown in FIG. 5A, the additional shielding structures 138 may individually exhibit substantially the same width $W_1$ in the X-direction as the spacer structures 132 (FIG. 4A); and may be separated (e.g., spaced) from one or more other, horizontally additional shielding structures 138 by substantially the same distance $D_1$ in the X-direction that separated the spacer structures 132 (FIG. 4A). In addition, the additional shielding structures 138 may individually exhibit a length in the Y-direction less than the length of the spacer structure 132 (FIG. 4A) employed to form the additional shielding structures 138.

The capping structures 140 of the fin structures 134 may serve as insulative cap structures for the additional shielding structures 138 of the fin structures 134. The capping structures 140 may be formed to have horizontally elongate shapes extending in parallel in the Y-direction, and may be separated from one another in the X-direction by the additional trenches 136. As shown in FIG. 5A, the capping structures 140 may individually exhibit substantially the same width $W_1$ in the X-direction as the spacer structures 132 (FIG. 4A), and may be separated (e.g., spaced) from one or more other, horizontally neighboring capping structures 140 by substantially the same distance $D_1$ in the X-direction that separated the spacer structures 132 (FIG. 4A). In addition, the capping structures 140 may individually exhibit a length in the Y-direction less than the length of the spacer structure 132 (FIG. 4A) employed to form the capping structures 140.

The dielectric end structures 137 of the fin structures 134 may alleviate short circuit risks that may otherwise be associated with extending the additional shielding structures 138 of the fin structures 134 into the opposing end regions 134B of the fin structures 134. For example, the dielectric end structures 137 of the fin structures 134 may permit subsequently formed conductive contacts (e.g., digit line contacts) to be extended (e.g., vertically extended in the Z-direction) to portions of subsequently formed conductive line structures (e.g., digit lines) horizontally proximate the opposing end regions 134B of the fin structures 134 with reduced risk of the conductive contacts short circuiting the additional shielding structures 138 of horizontally neighboring fin structures 134 as compared to configurations wherein the additional shielding structures 138 of the fin structures 134 horizontally extend into the opposing end regions 134B of the fin structures 134. Even if the subsequently formed conductive contacts horizontally overlap (e.g., in the X-direction) the opposing end regions 134B of horizontally neighboring fin structures 134, since the dielectric end structures 137 occupy the opposing end regions 134B (as opposed to the additional shielding structures 138), the subsequently formed conductive contacts will not effectuate short circuits between the additional shielding structures 138 of the horizontally neighboring fin structures 134. The dielectric end structures 137 of the fin structures 134 may individually exhibit substantially the same width $W_1$ in the X-direction as the spacer structures 132 (FIG. 4A), and may be separated (e.g., spaced) from one or more other, horizontally neighboring dielectric end structures 137 by substantially the same distance $D_1$ in the X-direction that separated the spacer structures 132 (FIG. 4A).

Figure 6A:
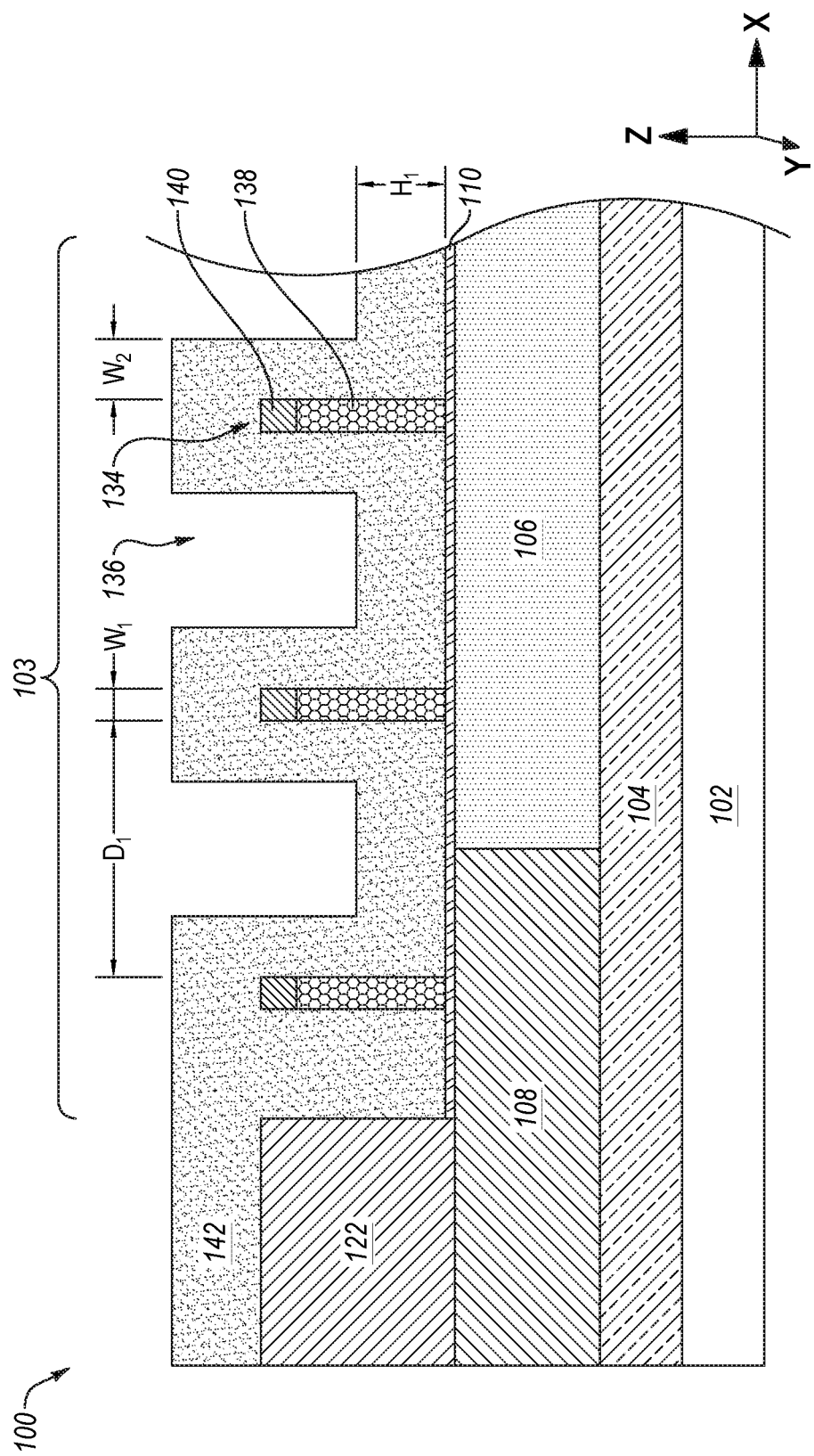

Next, referring collectively to FIG. 6A and FIG. 6B (which depicts a simplified partial top-down view of the microelectronic device structure 100 at the processing stage shown in FIG. 6A), a dielectric spacer material 142 may be formed on or over surfaces of the microelectronic device structure 100 inside and outside of boundaries (e.g., horizontal boundaries, vertical boundaries) of the additional trenches 136. In FIG. 6B, horizontal boundaries of some features (e.g., the fin structures 134, the additional peripheral dielectric structure 122) of the microelectronic device structure 100 vertically underlying the dielectric spacer material 142 are depicted by way of dashed lines. As shown in FIG. 6A, dielectric spacer material 142 may be formed to extend (e.g., continuously extend) over exposed surfaces (e.g., exposed upper surfaces, exposed side surfaces) of the fin structures 134 (including exposed surfaces of the dielectric end structures 137 (FIG. 6B), the additional shielding structures 138, and the capping structures 140 thereof), the additional peripheral dielectric structure 122, and the etch stop structure 110 (if present, or exposed surfaces of the peripheral dielectric structure 108 and the lower shielding structure 106 if the etch stop structure 110 is absent). The dielectric spacer material 142 may be formed to partially (e.g., less than completely) fill the additional trenches 136. In addition, as shown in FIG. 6A, the dielectric spacer material 142 may also be formed to substantially fill further trenches (if any) horizontally interposed (e.g., in the X-direction) between the additional peripheral dielectric structure 122 and the fin structures 134 most horizontally proximate (e.g., in the X-direction) thereto. In additional embodiments, such as embodiments wherein some of the fin structures 134 are formed directly horizontally adjacent (e.g., in the X-direction) the additional peripheral dielectric structure 122, the dielectric spacer material 142 does not horizontally intervene between the additional peripheral dielectric structure 122 and the fin structures 134 most horizontally proximate (e.g., in the X-direction) thereto.

As depicted in FIG. 6A, the dielectric spacer material 142 may be formed to have variable (e.g., non-constant, changing) thickness over different surfaces (e.g., side surfaces, upper surfaces) of the microelectronic device structure 100. For example, portions of the dielectric spacer material 142 formed on or over surfaces (e.g., upper surfaces) of the microelectronic device structure 100 defining lower vertical boundaries (e.g., floors, bottoms) of the additional trenches 136 may be formed to be relatively thicker than other portions of the dielectric spacer material 142 formed on or over other surfaces (e.g., side surfaces) of the microelectronic device structure 100 defining horizontal boundaries (e.g., sides) of the additional trenches 136. In some embodiments, a height $H_1$ (e.g., vertical thickness) of portions of the dielectric spacer material 142 formed on surfaces defining lower vertical boundaries of the additional trenches 136 is from about 2 times (2×) greater to about 3 times (3×) greater (e.g., from about 2.25 times (2.25×) greater to about 2.5 times (2.5×) greater, about 2.5× greater) than a width $W_2$ (e.g., horizontal thickness) of other portions of the dielectric spacer material 142 formed on other surfaces defining horizontal boundaries of the additional trenches 136. By way of non-limiting example, the height $H_1$ of the aforementioned portions of the dielectric spacer material 142 may be within a range of from about 24 nm to about 30 nm, and the width $W_2$ of the aforementioned other portions of the dielectric spacer material 142 may be within a range of from about 10 nm to about 12 nm.

The dielectric spacer material 142 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiment, the dielectric spacer material 142 is formed of and includes at least one low-k dielectric material, such as one or more of $SiO_xC_y$, $SiO_xN_y$, $SiC_xO_yH_z$, and $SiO_xC_zN_y$. The dielectric spacer material 142 may be substantially homogeneous, or the dielectric spacer material 142 may be heterogeneous. If the dielectric spacer material 142 is heterogeneous, amounts of one or more elements included in the dielectric spacer material 142 may vary stepwise (e.g., change abruptly), or may vary continuously (e.g., change progressively, such as linearly, parabolically) throughout different portions of the dielectric spacer material 142. The dielectric spacer material 142 may, for example, be formed of and include a stack of at least two different dielectric materials.

To facilitate the variable thickness of the dielectric spacer material 142, one or more deposition inhibition acts may be employed during the formation the dielectric spacer material 142. By way of non-limiting example, upper portions of the side surfaces of the fin structures 134 may be treated with plasma including one or more inhibitor materials (e.g., fluorine) that hinder deposition of the dielectric spacer material 142 on the upper portions of the side surfaces of the fin structures 134. The inhibitor material(s) may be formed on upper portions of the side surfaces of the fin structures 134 without being substantially formed on lower portions of the side surfaces of the fin structures 134 and on surfaces defining lower boundaries of the additional trenches 136. Thereafter, at least one material deposition process (e.g., at least one ALD process, at least one a CVD process) may be employed to form the dielectric spacer material 142 over exposed surfaces of the microelectronic device structure 100. The inhibitor material(s) may temporarily obstruct the formation of the dielectric spacer material 142 thereon relative to other portions of the microelectronic device structure 100 not having the inhibitor material(s) thereon, such that the dielectric spacer material 142 is formed to exhibit the variable thickness previously described herein. Optionally, deposition inhibition acts (e.g., plasma treatment acts) may be cycled with material deposition acts (e.g., ALD acts, CVD acts) to form the dielectric spacer material 142.

Figure 7A:
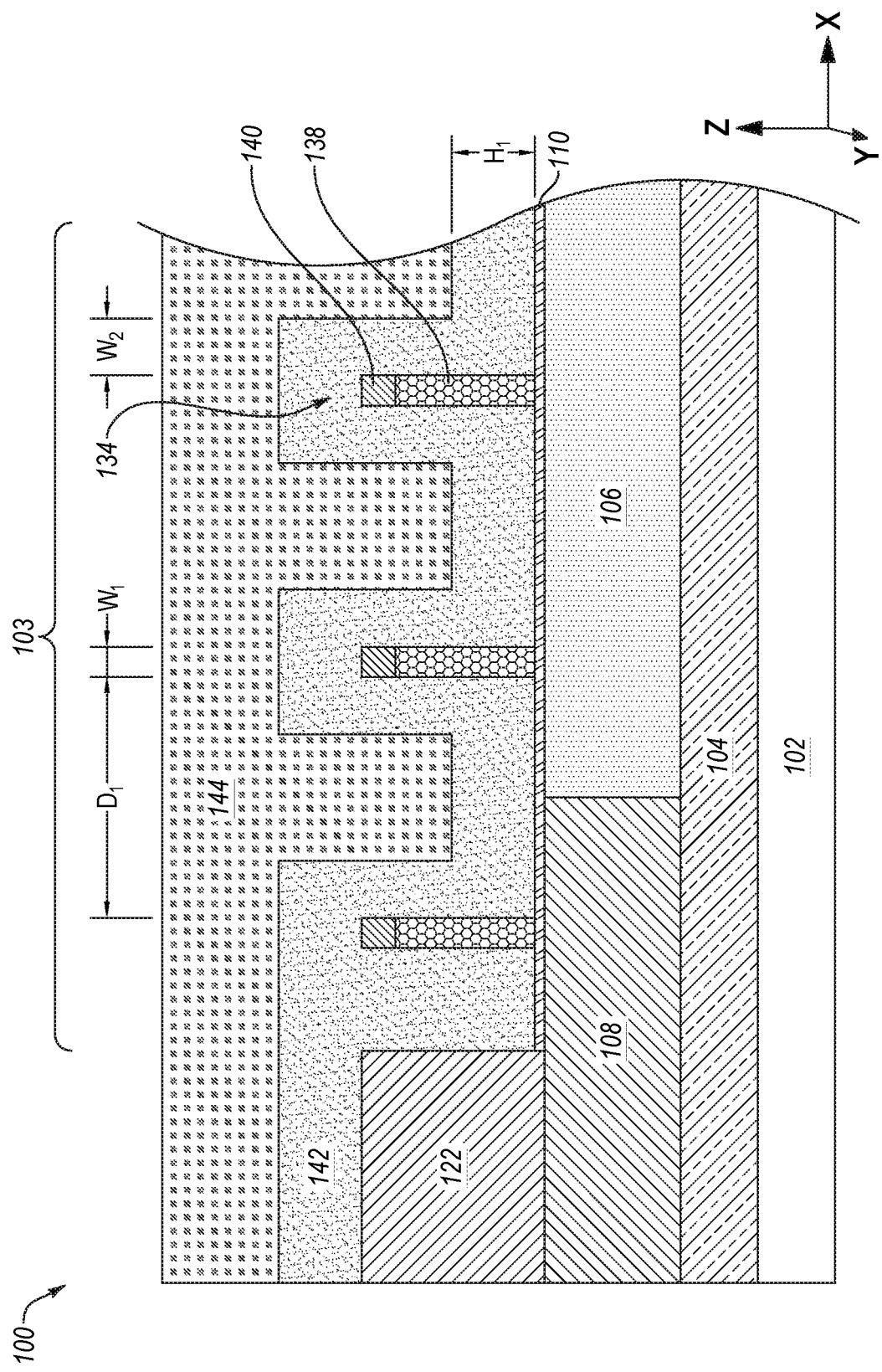
Figure 7B:
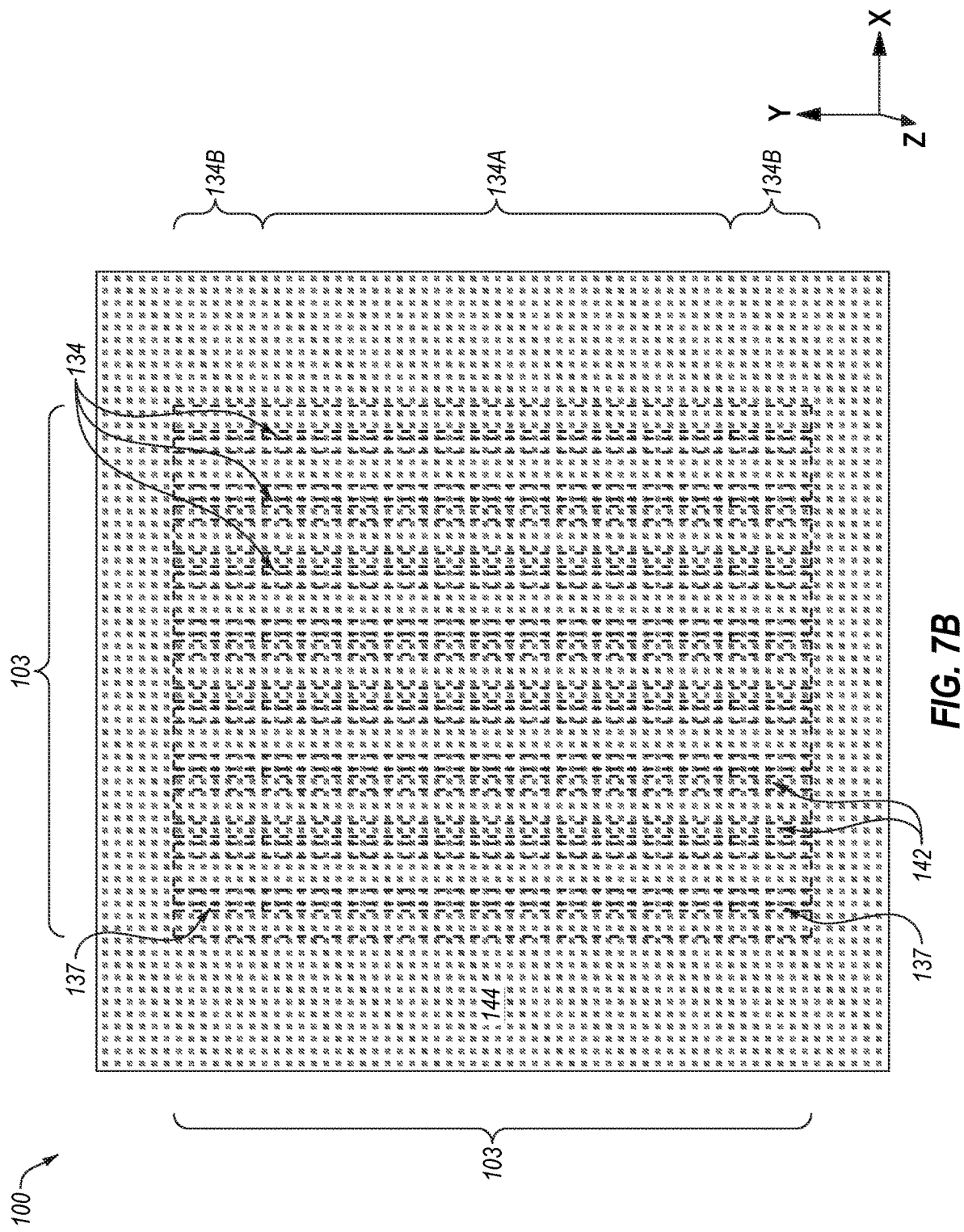

Next, referring collectively to FIG. 7A and FIG. 7B (which depicts a simplified partial top-down view of the microelectronic device structure 100 at the processing stage shown in FIG. 7A), a digit line material 144 may be formed on or over the dielectric spacer material 142. The digit line material 144 may be formed on or over surfaces of the dielectric spacer material 142 inside and outside of boundaries (e.g., horizontal boundaries, vertical boundaries) of the additional trenches 136 (FIG. 6A). In FIG. 7B, horizontal boundaries of some features (e.g., the fin structures 134, the additional peripheral dielectric structure 122, the dielectric spacer material 142) of the microelectronic device structure 100 vertically underlying the digit line material 144 are depicted by way of dashed lines. The digit line material 144 may be formed to substantially (e.g., completely) fill portions of the additional trenches 136 (FIG. 6A) remaining unfilled by the dielectric spacer material 142.

The digit line material 144 may be formed of and include conductive material. In some embodiments, the digit line material 144 is formed of and includes metallic material, such as one or more of at least one metal, at least one alloy, and at least one conductive metal-containing material (e.g., a conductive metal nitride, a conductive metal silicide, a conductive metal carbide, a conductive metal oxide). By way of non-limiting example, the digit line material 144 may be formed of and include W. The digit line material 144 may be substantially homogeneous, or the digit line material 144 may be heterogeneous. If the digit line material 144 is heterogeneous, amounts of one or more elements included in the digit line material 144 may vary stepwise (e.g., change abruptly), or may vary continuously (e.g., change progressively, such as linearly, parabolically) throughout different portions of the digit line material 144. The digit line material 144 may, for example, be formed of and include a stack of at least two different conductive materials.

Figure 8A:
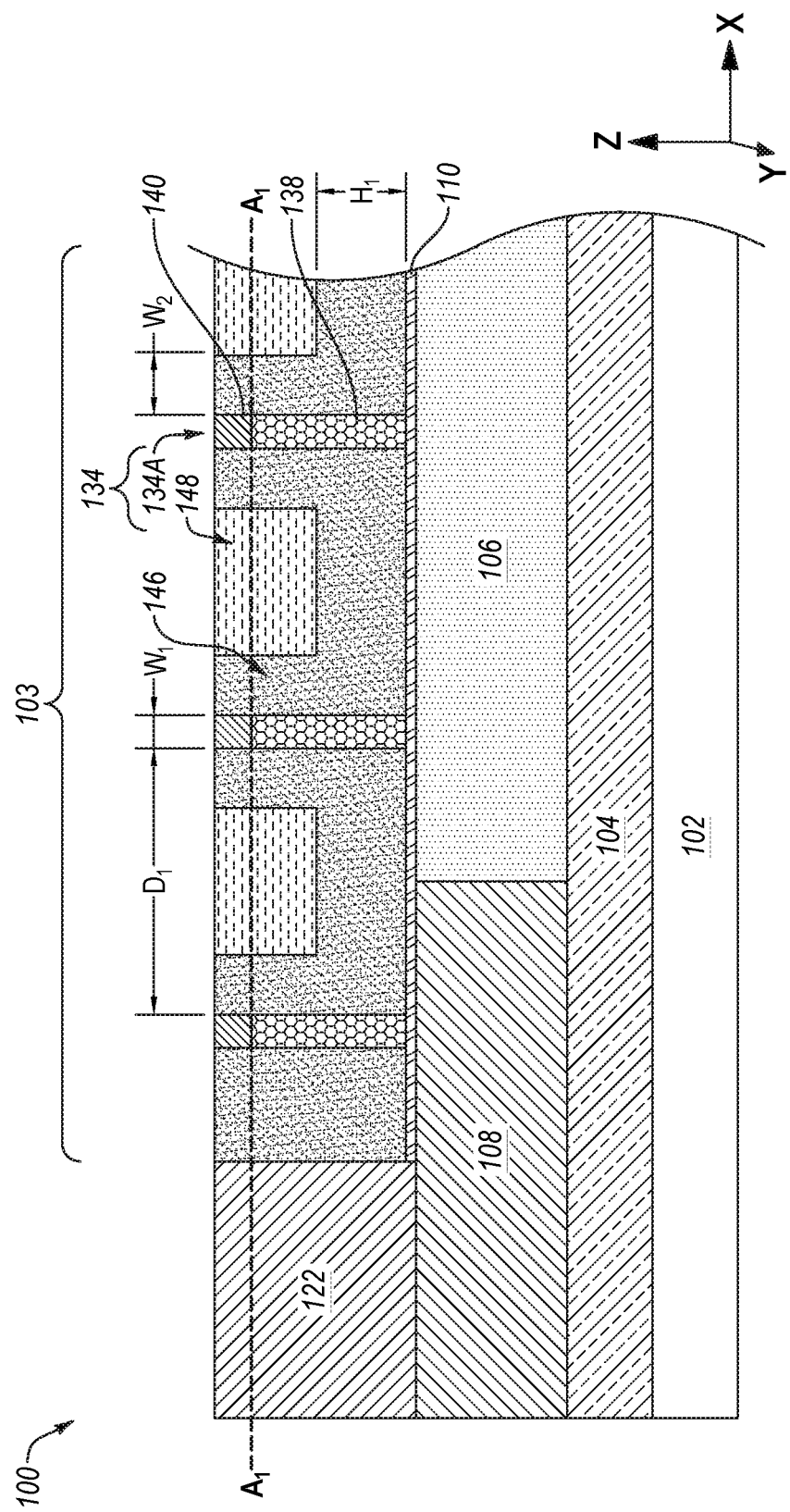
Figure 8B:
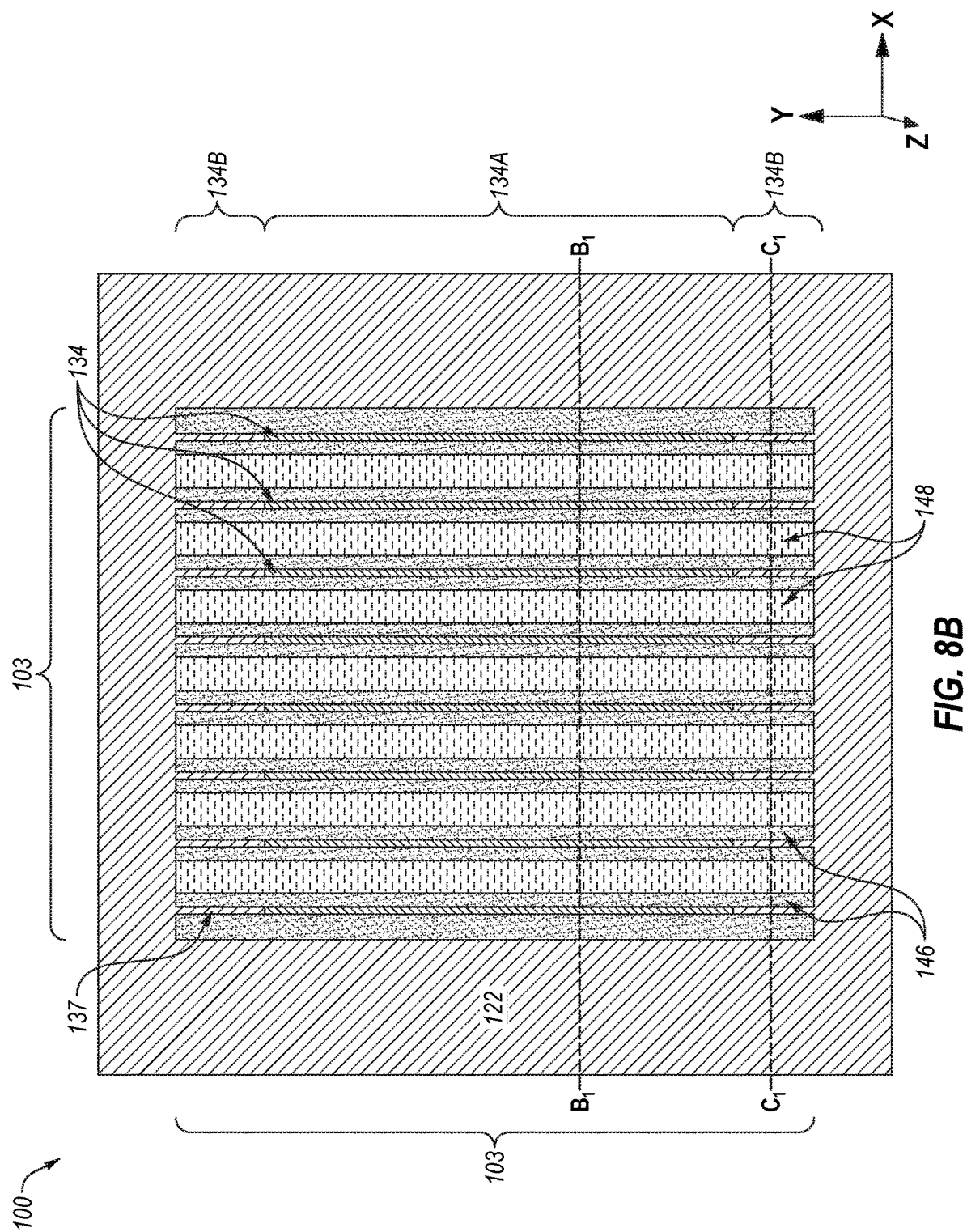
Figure 8C:
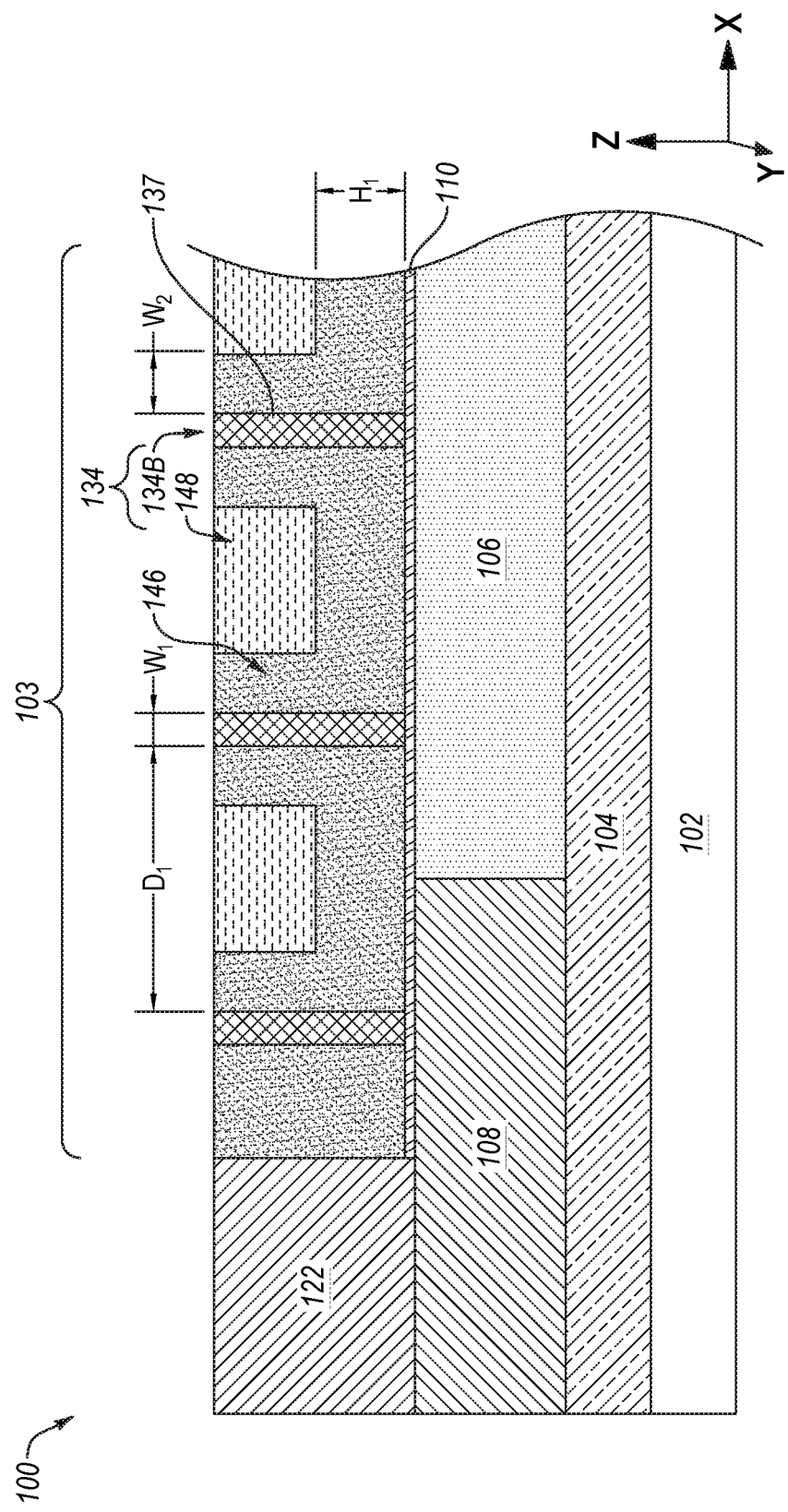

Next, referring collectively to FIG. 8A, FIG. 8B, and FIG. 8C, portions of the dielectric spacer material 142 (FIG. 7A) and the digit line material 144 (FIG. 7A) vertically overlying (e.g., in the Z-direction) the fin structures 134 may be removed to form dielectric spacer structures 146 from the dielectric spacer material 142 (FIG. 7A) and digit lines 148 (e.g., data lines, bit lines) from the digit line material 144 (FIG. 7A). The view depicted in FIG. 8A is a simplified partial cross-sectional view of the microelectronic device structure 100 about the dashed line $B_1$-$B_1$ illustrated in FIG. 8B. The view depicted in FIG. 8C is a simplified partial cross-sectional view of the microelectronic device structure 100 about the dashed line $C_1$-$C_1$ illustrated in FIG. 8B. Accordingly, and as described in further detail below, the view depicted in FIG. 8A illustrates the central regions 134A of some of the fin structures 134 of the microelectronic device structure 100; and the view depicted in FIG. 8C illustrates one of the opposing end regions 134B of some of the fin structures 134 of the microelectronic device structure 100.

As shown in FIG. 8A, portions of the dielectric spacer material 142 (FIG. 7A) and the digit line material 144 (FIG. 7A) vertically overlying upper boundaries (e.g., upper surfaces) of the capping structures 140 of the fin structures 134 may be removed to form the dielectric spacer structures 146 and the digit lines 148. In such embodiments, upper boundaries (e.g., upper surfaces) of the dielectric spacer structures 146 and the digit lines 148 may be formed to be substantially coplanar with the upper boundaries of the capping structures 140. In additional embodiments, the capping structures 140, as well as portions of the additional peripheral dielectric structure 122 and the dielectric end structures 137 (FIGS. 8B and 8C) at substantially the same vertical position as the capping structures 140, may also be removed in the process of forming the dielectric spacer structures 146 and the digit lines 148. In some such embodiments, upper boundaries of the dielectric spacer structures 146 and the digit lines 148 are substantially coplanar with upper boundaries of the additional shielding structures 138 of the fin structures 134, as depicted by the dashed line $A_1$-$A_1$ shown in FIG. 8A.

The digit lines 148 may be formed to have horizontally elongate shapes extending in parallel in the Y-direction, and separated from one another in the X-direction by the fin structures 134. As shown in FIG. 8A, within the central region 134A of the fin structures 134, the additional shielding structures 138 horizontally intervene in the X-direction between horizontally neighboring digit lines 148. Accordingly, the additional shielding structures 138 may mitigate (e.g., reduce, impeded, prevent) undesirable electrical interference (e.g., cross-talk) between the horizontally neighboring digit lines 148.

The dielectric spacer structures 146 may be formed to substantially cover and surround horizontal boundaries in X-direction and lower vertical boundaries in the Z-direction of the digit lines 148. The dielectric spacer structures 146 may be formed to have horizontally elongate geometries extending in parallel in the Y-direction and having U-shape transverse cross-sectional shapes. Upper portions of the dielectric spacer structures 146 may horizontally intervene between the digit lines 148 and the fin structures 134, and lower portions of the dielectric spacer structures 146 may vertically intervene between the digit lines 148 and the lower shielding structure 106 (as well as the etch stop structure 110, if any) of the microelectronic device structure 100.

As shown in FIG. 8C, within the opposing end regions 134B of the fin structures 134, the dielectric end structures 137 horizontally intervene in the X-direction between horizontally neighboring digit lines 148. Upper boundaries of the dielectric end structures 137 may be substantially coplanar with upper boundaries of the dielectric spacer structures 146 and the digit lines 148. As previously discussed, having the dielectric end structures 137 of the fin structures 134 horizontally intervene between the digit lines 148 may relax constraints (e.g., as influenced by short circuit risks) on the formation of conductive contacts (e.g., digit line contacts) within horizontal boundaries in the Y-direction of the opposing end regions 134B of the fin structures 134 that may otherwise be employed if the additional shielding structures 138 (FIG. 8A) of the fin structures 134 were used in place of the dielectric end structures 137 in the opposing end regions 134B of the fin structures 134.

Figure 9A:
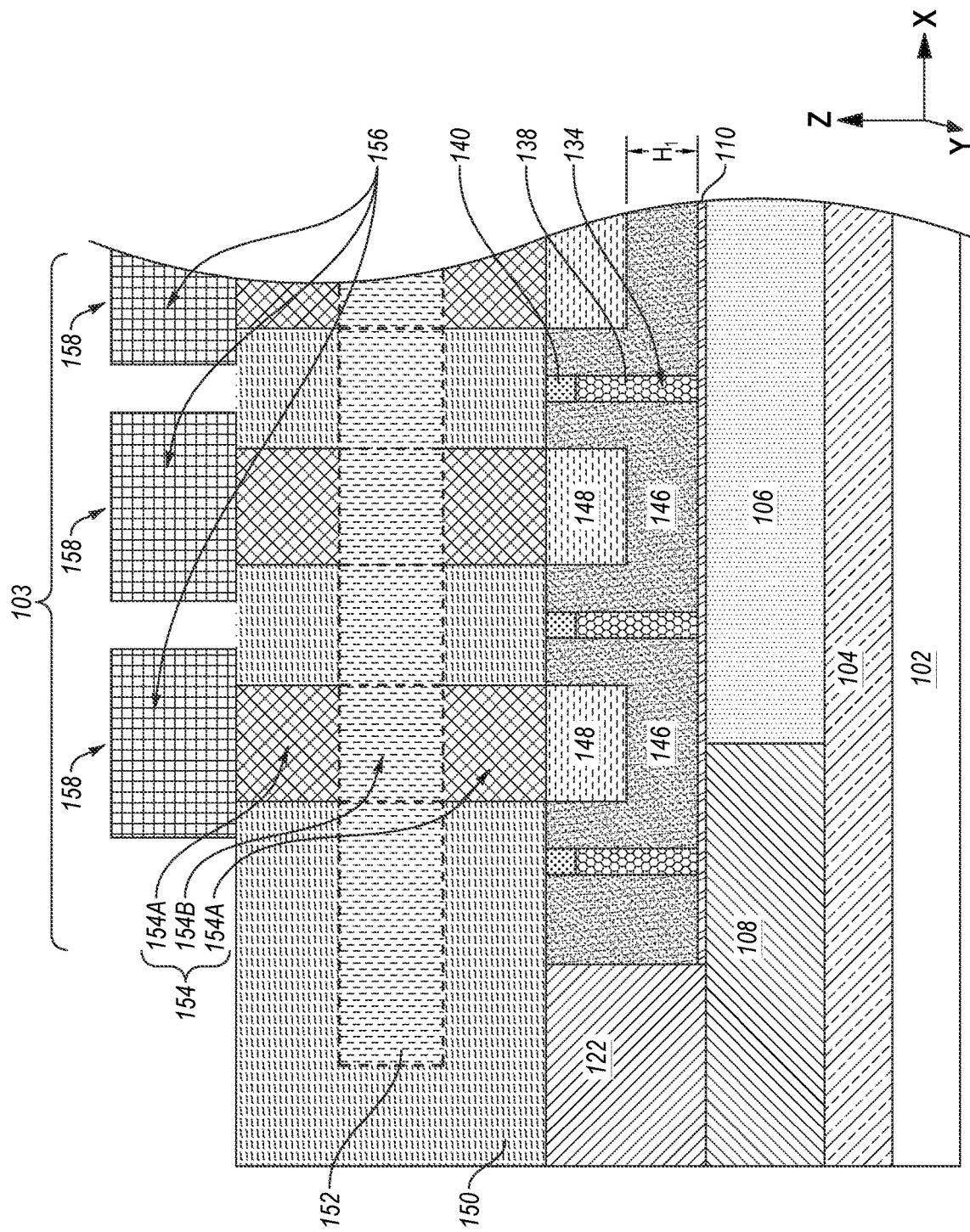
Figure 9B:
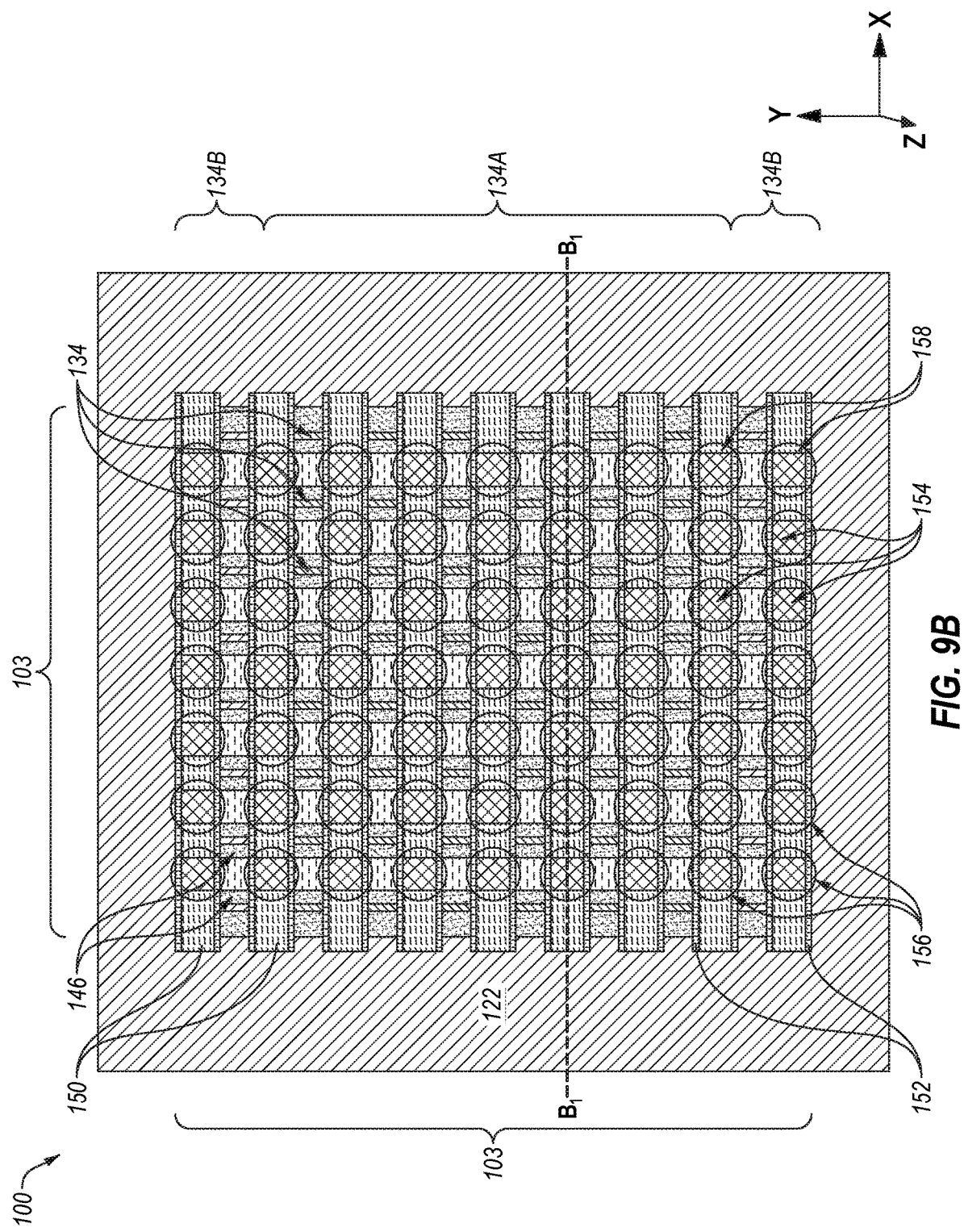

Next, referring collectively to FIG. 9A and FIG. 9B (which depicts a simplified partial top-down view of the microelectronic device structure 100 at the processing stage shown in FIG. 9A), isolation material 150, access lines 152 (e.g., word lines), vertical access devices 154 (e.g., vertical transistors), and storage node structures 156 (e.g., capacitors) may be formed over upper vertical boundaries of the digit lines 148. The vertical access devices 154 and the storage node structures 156 may together form memory cells 158 each individually including one of the vertical access devices 154 and one of the storage node structures 156. The foregoing features of the microelectronic device structure 100 at the processing stage depicted in FIG. 9A and FIG. 9B, are described in further detail below. The view depicted in FIG. 9A is a simplified partial cross-sectional view of the microelectronic device structure 100 about the dashed line $B_1$-$B_1$ illustrated in FIG. 9B. For clarity and ease of understanding of the drawings and related description, not all features depicted in one of FIG. 9A and FIG. 9B are depicted in the other of FIG. 9A and FIG. 9B. As a non-limiting example, the isolation material 150 shown in FIG. 9A has been omitted from FIG. 9B to more clearly illustrate features of the microelectronic device structure 100 vertically underlying the isolation material 150. In addition, the storage node structures 156 have been depicted as transparent to more clearly illustrate features (e.g., the vertical access devices 154) of the microelectronic device structure 100.

The access lines 152 may be formed to have horizontally elongate shapes extending in parallel in the X-direction. The access lines 152 may horizontally extend orthogonal to the digit lines 148. The vertical access devices 154 may be formed to horizontally intervene in the Y-direction between horizontally neighboring access lines 152, as described in further detail below. The access lines 152 may be employed as conductive gate structures for the vertical access devices 154, as also describe in further detail below. In FIG. 9A, an individual access line 152 is depicted with dashed lines to indicate that the access line 152 is horizontally neighbors, in the Y-direction, the vertical access devices 154 depicted in FIG. 9A, even though the access line 152 does not lie within the plane of the cross-section of the microelectronic device structure 100 indicated by the dashed line $B_1$-$B_1$ in FIG. 9B.

The access lines 152 may be formed of and include conductive material. In some embodiments, the access lines 152 are individually formed of and include metallic material, such as one or more of at least one metal, at least one alloy, and at least one conductive metal-containing material (e.g., a conductive metal nitride, a conductive metal silicide, a conductive metal carbide, a conductive metal oxide). By way of non-limiting example, the access lines 152 may individually be formed of and include W. The access lines 152 may individually be substantially homogeneous, or the access lines 152 may individually be heterogeneous. If an individual access line 152 is heterogeneous, amounts of one or more elements included in the access line 152 may vary stepwise (e.g., change abruptly), or may vary continuously (e.g., change progressively, such as linearly, parabolically) throughout different portions of the access line 152. The access line 152 may, for example, be formed of and include a stack of at least two different conductive materials.

The vertical access devices 154 may be formed vertically on or over and in electrical communication with the digit lines 148. As shown in FIG. 9A, in some embodiments, the vertical access devices 154 are formed on the digit lines 148. Each vertical access device 154 may include conductively doped regions 154A (serving as source and drain regions) and a channel region 154B vertically interposed between the conductively doped regions 154A. In addition, each vertical access device 154 may individually include a portion of at least one of the access lines 152 horizontally neighboring (e.g., in the Y-direction) and at least partially within vertical boundaries (e.g., in the Z-direction) of the channel region 154B thereof. The portion of the access line 152 may serve as a gate for the vertical access device 154. In addition, at least one gate dielectric material may be formed to horizontally intervene between the channel region 154B of each vertical access device 154 and the portion of the access line 152 horizontally neighboring the channel region 154B.

For each of the vertical access devices 154, the conductively doped regions 154A and the channel region 154B thereof may be formed of and include a semiconductive material, such as at one or more of a silicon material (e.g., polycrystalline silicon), a silicon-germanium material, a germanium material, a gallium arsenide material, a gallium nitride material, and an indium phosphide material. In some embodiments, the conductively doped regions 154A and the channel region 154B each include polycrystalline silicon. In addition, the conductively doped regions 154A of each vertical access device 154 may be doped with one or more desired dopants. In some embodiments, the conductively doped regions 154A of at least one vertical access device 154 are formed of and include a semiconductive material (e.g., polycrystalline silicon) doped with at least one N-type dopant (e.g., one or more of phosphorus, arsenic, antimony, and bismuth). In some of such embodiments, the channel region 154B of the vertical access device 154 is formed of and includes the semiconductive material doped with at least one P-type dopant (e.g., one or more of boron, aluminum, and gallium). In some other of such embodiments, the channel region 154B of the vertical access device 154 is formed of and includes substantially undoped semiconductive material. In additional embodiments, the conductively doped regions 154A of at least one vertical access device 154 are formed of and include a semiconductive material (e.g., polycrystalline silicon) doped with at least one P-type dopant (e.g., one or more of boron, aluminum, and gallium). In some of such additional embodiments, the channel region 154B of the vertical access device 154 is formed of and includes the semiconductive material doped with at least one N-type dopant (e.g., one or more of phosphorus, arsenic, antimony, and bismuth). In some other of such additional embodiments, the channel region 154B of the vertical access device 154 is formed of and includes substantially undoped semiconductive material.

As shown in FIG. 9A, the storage node structures 156 (e.g., capacitors) may be formed vertically over and in electrical communication with the vertical access devices 154. The storage node structures 156 may be configured to store a charge representative of a programmable logic state. For example, a charged state of the storage node structures 156 may represent a first logic state (e.g., a logic 1), and an uncharged state of the storage node structures 156 may represent a second logic state (e.g., a logic 0). In some embodiments, the storage node structures 156 comprise a dielectric material configured to storage a charge associated with a logic state. The dielectric material may, for example, comprise one or more of include silicon dioxide, silicon nitride, polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT), etc.), and a high-k dielectric material. In some embodiments, the storage node structures 156 are formed of and include zirconium oxide.

As illustrated in FIG. 9A, the isolation material 150 may be formed on or over the additional peripheral dielectric structure 122, the dielectric spacer structures 146, and the fin structures 134. The isolation material 150 may be formed to cover and surround of portions of at least the access lines 152 and the vertical access devices 154. The isolation material 150 may also be formed to at least partially cover and surround the storage node structures 156. The isolation material 150 may be formed of and include at least one insulative material. By way of non-limiting example, the isolation material 150 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), at least one dielectric carboxynitride material (e.g., $SiO_xC_zN_y$), and amorphous carbon. In some embodiments, the isolation material 150 is formed of and includes $SiO_x$ (e.g., $SiO_2$). The isolation material 150 may be substantially homogeneous, or the isolation material 150 may be heterogeneous. If the isolation material 150 is heterogeneous, amounts of one or more elements included in the isolation material 150 may vary stepwise (e.g., change abruptly), or may vary continuously (e.g., change progressively, such as linearly, parabolically) throughout different portions of the isolation material 150. The isolation material 150 may, for example, be formed of and include a stack of at least two different insulative materials.

Following the formation of the memory cells 158 (including the vertical access devices 154 and the storage node structures 156 thereof), the microelectronic device structure 100 may be subjected to additional processing to form a microelectronic device including the microelectronic device structure 100. By way of non-limiting example, conductive contact structures may be formed to electrically connect (e.g., couple) the memory cells 158 to control logic circuitry of control logic devices within the control logic region 104. At least some of such conductive contact structures may, for example, be formed to vertically extend through the peripheral dielectric structure 108 and the additional peripheral dielectric structure 122 of the microelectronic device structure 100.

Thus, in accordance with embodiments of the disclosure, a method of forming a microelectronic device comprises forming a conductive shielding material over each of a conductive shielding structure and a first dielectric structure horizontally adjacent the conductive shielding structure. A second dielectric structure is formed on first dielectric structure and horizontally adjacent the conductive shielding material. The conductive shielding material and the second dielectric structure are patterned to form fin structures extending in parallel with one another in a first horizontal direction. Each of the fin structures comprises two dielectric end structures integral with remaining portions of the second dielectric structure, and an additional conductive shielding structure interposed between the two dielectric end structures in the first horizontal direction. First conductive lines are formed to extend in parallel with one another in the first horizontal direction and to horizontally alternate with the fin structures in a second horizontal direction orthogonal to the first horizontal direction.

Furthermore, in accordance with embodiments of the disclosure, a microelectronic device comprises a lower conductive shielding structure, a dielectric structure, conductive lines, fin structures, dielectric spacer structures, and an additional dielectric structure. The dielectric structure substantially surrounds outer horizontal boundaries of the lower conductive shielding structure. The conductive lines overlie the lower conductive shielding structure and extend in parallel in a first horizontal direction. The fin structures overlie the lower conductive shielding structure and extend in parallel in a first horizontal direction. The fin structures are interposed between the conductive lines in a second horizontal direction orthogonal to the first horizontal direction. The fin structures each comprise opposing dielectric end structures, and an additional conductive shielding structure interposed between the opposing dielectric end structures. The dielectric spacer structures are interposed between the fin structures and each of the lower conductive shielding structure and the conductive lines. The additional dielectric structure is on the dielectric structure and substantially horizontally surrounds an area occupied by the conductive lines, the fin structures, and the dielectric spacer structures.

Figure 10:
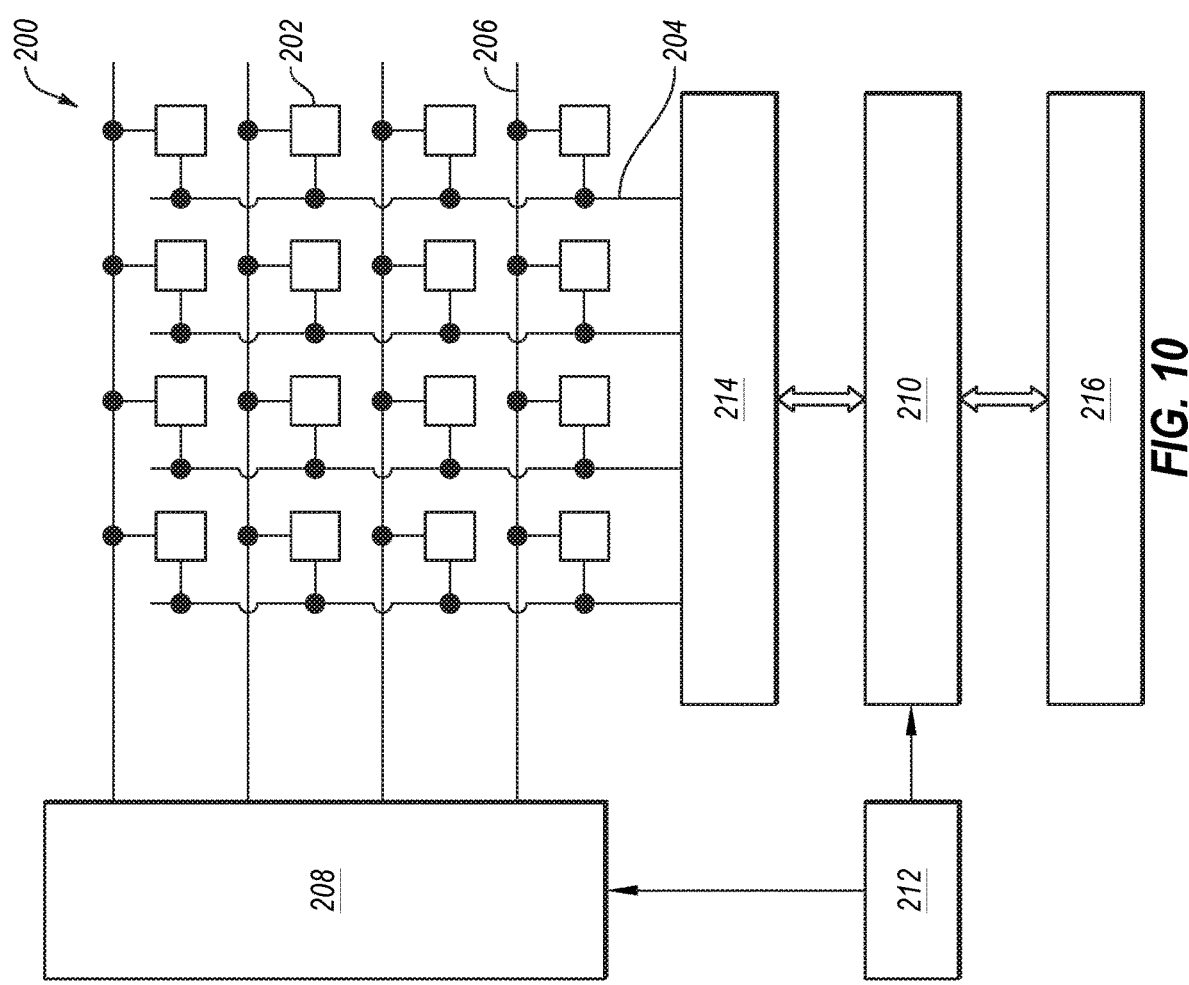
FIG. 10 is a functional block diagram of a memory device, in accordance with an embodiment of the disclosure.

FIG. 10 illustrates a functional block diagram of a microelectronic device 200 (e.g., a memory device, such as a DRAM device), in accordance with an embodiment of the disclosure. The microelectronic device 200 may include, for example, an embodiment of the microelectronic device structure 100 following the processing stage previously described with reference to FIGS. 9A and 9B. As shown in FIG. 10, the microelectronic device 200 may include memory cells 202 (e.g., corresponding to the memory cells 158 previously described with reference to FIGS. 9A and 9B), digit lines 204 (e.g., corresponding to the digit lines 148 previously described with reference to FIGS. 8A through 9B), access lines 206 (e.g., corresponding to the access lines 152 previously described with reference to FIGS. 9A and 9B), a row decoder 208, a column decoder 210, a memory controller 212, a sense device 214, and an input/output device 216. One or more (e.g., each) of the row decoder 208, the column decoder 210, the memory controller 212, the sense device 214, and the input/output device 216 may, for example, be located within the control logic region 104 previously described with reference to FIGS. 1A and 1B for the microelectronic device structure 100. The microelectronic device 200 also includes the other features of the microelectronic device structure 100 following the processing stage previously described with reference to FIGS. 9A and 9B, such as the lower shielding structure 106, the peripheral dielectric structure 108, the additional peripheral dielectric structure 122, the fin structures 134 (including at least the additional shielding structures 138 and the dielectric end structures 137 thereof), and the dielectric spacer structures 146.

The memory cells 202 of the microelectronic device 200 are programmable to at least two different logic states (e.g., logic 0 and logic 1). Each memory cell 202 may individually include a storage node structure (e.g., corresponding to one of the storage node structures 156 previously described with reference to FIGS. 9A and 9B) capacitor and vertical access device (e.g., corresponding to one of the vertical access devices 154 previously described with reference to FIGS. 9A and 9B). The storage node structure stores a charge representative of the programmable logic state (e.g., a charged capacitor may represent a first logic state, such as a logic 1; and an uncharged capacitor may represent a second logic state, such as a logic 0) of the memory cell 202. The vertical access device grants access to the storage node structure upon application (e.g., by way of one of the access lines 206) of a minimum threshold voltage to a channel region (e.g., corresponding to the channel region 154B previously described with reference to FIGS. 9A and 9B) thereof for operations (e.g., reading, writing, rewriting) on the storage node structure.

Operations may be performed on the memory cells 202 by activating appropriate digit lines 204 and access lines 206. Activating a digit line structure 204 or an access line structure 206 may include applying a voltage potential to the digit line structure 204 or the access line structure 206. Each column of memory cells 202 may individually be connected to one of the digit lines 204, and each row of the memory cells 202 may individually be connected to one of the access lines 206. Individual memory cells 202 may be addressed and accessed through the intersections of the digit lines 204 and the access lines 206.

The memory controller 212 may control the operations of memory cells 202 through various components, including the row decoder 208, the column decoder 210, and the sense device 214. The memory controller 212 may generate row address signals that are directed to the row decoder 208 to activate (e.g., apply a voltage potential to) predetermined access lines 206, and may generate column address signals that are directed to the column decoder 210 to activate (e.g., apply a voltage potential to) predetermined digit lines 204. The memory controller 212 may also generate and control various voltage potentials employed during the operation of the microelectronic device 200. In general, the amplitude, shape, and/or duration of an applied voltage may be adjusted (e.g., varied), and may be different for various operations of the microelectronic device 200.

During use and operation of the microelectronic device 200, after being accessed, a memory cell 202 may be read (e.g., sensed) by the sense device 214. The sense device 214 may compare a signal (e.g., a voltage) of an appropriate digit line structure 204 to a reference signal in order to determine the logic state of the memory cell 202. If, for example, the digit line structure 204 has a higher voltage than the reference voltage, the sense device 214 may determine that the stored logic state of the memory cell 202 is a logic 1, and vice versa. The sense device 214 may include transistors and amplifiers to detect and amplify a difference in the signals (commonly referred to in the art as "latching"). The detected logic state of a memory cell 202 may be output through the column decoder 210 to the input/output device 216. In addition, a memory cell 202 may be set (e.g., written) by similarly activating an appropriate access line structure 206 and an appropriate digit line structure 204 of the microelectronic device 200. By controlling the digit line structure 204 while the access line structure 206 is activated, the memory cell 202 may be set (e.g., a logic value may be stored in the memory cell 202). The column decoder 210 may accept data from the input/output device 216 to be written to the memory cells 202. Furthermore, a memory cell 202 may also be refreshed (e.g., recharged) by reading the memory cell 202. The read operation will place the contents of the memory cell 202 on the appropriate digit line structure 204, which is then pulled up to full level (e.g., full charge or discharge) by the sense device 214. When the access line structure 206 associated with the memory cell 202 is deactivated, all of memory cells 202 in the row associated with the access line structure 206 are restored to full charge or discharge.

Thus, in accordance with embodiments of the disclosure, a memory device comprises a conductive shielding structure, a first peripheral dielectric structure, a second peripheral dielectric structure, and a memory array region. The conductive shielding structure overlies a base structure. The first peripheral dielectric structure overlies the base structure and outwardly horizontally neighbors the conductive shielding structure. The second peripheral dielectric structure is on the first peripheral dielectric structure. The memory array region inwardly horizontally neighbors the second peripheral dielectric structure. The memory array region comprises fin structures, digit lines, dielectric spacer structures, access lines, and memory cells. The fin structures overlie the conductive shielding structure and extend in a first horizontal direction. Each of the fin structures comprises two dielectric end structures projecting from and integral with the second peripheral dielectric structure, and an additional conductive shielding structure horizontally interposed between the two dielectric end structures. The digit lines overlie the conductive shielding structure and extend in the first horizontal direction. The digit lines alternate with the fin structures in a second horizontal direction perpendicular to the first horizontal direction. The dielectric spacer structures are horizontally interposed between the digit lines and the fin structures, and are vertically interposed between the digit lines and the conductive shielding structure. The access lines overlie the digit lines and extend in parallel in the second horizontal direction. The memory cells overlie the digit lines and are in electrical communication with the digit lines and the access lines.

Microelectronic devices structures (e.g., the microelectronic device structure 100 following the processing stage previously described with reference to FIGS. 9A and 9B) and microelectronic devices (e.g., the microelectronic device 200 previously described with reference to FIG. 10) in accordance with embodiments of the disclosure may be used in embodiments of electronic systems of the disclosure. For example, FIG. 11 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The memory device 302 may comprise, for example, one or more of a microelectronic device structure (e.g., the microelectronic device structure 100 following the processing stage previously described with reference to FIGS. 9A and 9B) and a microelectronic device (e.g., the microelectronic device 200 previously described with reference to FIG. 10) previously described herein. The electronic system 300 may further include at least one electronic signal processor device 304 (often referred to as a "microprocessor"). The electronic signal processor device 304 may, optionally, include one or more of a microelectronic device structure (e.g., the microelectronic device structure 100 following the processing stage previously described with reference to FIGS. 9A and 9B) and a microelectronic device (e.g., the microelectronic device 200 previously described with reference to FIG. 10) previously described herein. While the memory device 302 and the electronic signal processor device 304 are depicted as two (2) separate devices in FIG. 10, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., the microelectronic device structure 100 following the processing stage previously described with reference to FIGS. 9A and 9B) and a microelectronic device (e.g., the microelectronic device 200 previously described with reference to FIG. 10) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises, an input device, an output device, a processor device operably connected to the input device and the output device, and a memory device operably connected to the processor device. The memory device comprises a shielding plate, a peripheral dielectric structure, an additional peripheral dielectric structure, fin structures, digit lines, access lines, and memory cells. The shielding plate comprises conductive material. The peripheral dielectric structure horizontally circumscribes the shielding plate. The additional peripheral dielectric structure is vertically on the peripheral dielectric structure and has inner horizontal boundaries outwardly offset from inner horizontal boundaries of the peripheral dielectric structure. The fin structures vertically overlie the shielding plate and extend in parallel in a first horizontal direction. The fin structures each comprise two dielectric end structures horizontally protruding from the additional peripheral dielectric structure, and an additional shielding structure comprising additional conductive material extending from and between the two dielectric end structures. The digit lines horizontally alternate with the fin structures. Upper surfaces of the digit lines are substantially coplanar with upper surfaces of the fin structures. The access lines vertically overlie the digit lines and extend in parallel in a second horizontal direction orthogonal to the first horizontal direction. The memory cells vertically overlie the digit lines and are coupled to the digit lines and the access lines.

The methods, structures, and devices of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The methods, structures, and devices of the disclosure may also improve scalability, efficiency, and simplicity as compared to conventional methods, conventional structures, and conventional devices. The methods and structures of the disclosure may alleviate problems related to the formation and processing of conventional microelectronic devices including shielding structures for conductive lines (e.g., digit lines) thereof. For example, the methods and structures of the disclosure do not suffer from the relatively small sizing and spacing error margins conventionally associated with properly forming shielding structures for digit lines. In addition, the methods and structures of the disclosure may reduce the risk of undesirable short circuits as compared to conventional methods and conventional structures.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A method of forming a microelectronic device, comprising:
    forming a conductive shielding material over each of a conductive shielding structure and a first dielectric structure horizontally adjacent the conductive shielding structure;
    forming a second dielectric structure on first dielectric structure and horizontally adjacent the conductive shielding material;
    patterning the conductive shielding material and the second dielectric structure to form fin structures extending in parallel with one another in a first horizontal direction, each of the fin structures comprising:
        two dielectric end structures integral with remaining portions of the second dielectric structure; and
        an additional conductive shielding structure interposed between the two dielectric end structures in the first horizontal direction; and
    forming first conductive lines extending in parallel with one another in the first horizontal direction and horizontally alternating with the fin structures in a second horizontal direction orthogonal to the first horizontal direction.

2. The method of claim 1, further comprising forming dielectric spacer structures composing upper portions horizontally interposed between the first conductive lines and the fin structures and lower portions vertically interposed between the first conductive lines and the conductive shielding structure.

3. The method of claim 2, further comprising forming the lower portions of the dielectric spacer structures to a vertical height at least two times greater than a horizontal width of each of the upper portions of the dielectric spacer structures in the second horizontal direction.

4. The method of claim 2, wherein forming the dielectric spacer structures and forming the first conductive lines comprises:
    forming a dielectric spacer material over and between the fin structures, the dielectric spacer material partially filling trenches interposed between the fin structures in the second horizontal direction;
    forming a conductive material over the dielectric spacer material, the conductive material substantially fill portions of the trenches unoccupied by the dielectric spacer material; and
    removing portions of the dielectric spacer material and the conductive material vertically overlying the fin structures to the form the dielectric spacer structures from the dielectric spacer material and the first conductive lines from the conductive material.

5. The method of claim 1, further comprising:
    forming a dielectric capping material on the conductive shielding material; and
    patterning the dielectric capping material while patterning the conductive shielding material and the second dielectric structure to form the fin structures, each of the fin structures formed to further comprise a dielectric capping structure formed from the dielectric capping material on the additional conductive shielding structure thereof.

6. The method of claim 1, wherein forming a second dielectric structure on the first dielectric structure and horizontally adjacent the conductive shielding material comprises:
    removing a portion of the conductive shielding material proximate an outer horizontal boundary of the conductive shielding material to form a recess vertically extending through the conductive shielding material to the first dielectric structure; and forming the second dielectric structure within the recess vertically extending through the conductive shielding material.

7. The method of claim 1, further comprising forming a conductive etch stop structure vertically between the conductive shielding material and each of the conductive shielding structure and the first dielectric structure prior to forming the second dielectric structure.

8. The method of claim 1, wherein patterning the conductive shielding material and the second dielectric structure comprises:

forming a masking structure over the second dielectric structure and the conductive shielding material;

forming spacer structures over the masking structure, the spacer structures separated from one another by trenches and having widths in the second horizontal direction corresponding to widths in the second horizontal direction of the fin structures to be formed;

forming an additional masking structure over the masking structure and at least partially horizontally overlapping the second dielectric structure; and transferring a pattern at least partially defined by the spacer structures and the additional masking structure into the second dielectric structure and the conductive shielding material.

9. The method of claim 1, further comprising:

forming second conductive lines over the first conductive lines, the second conductive lines extending in parallel with one another in the second horizontal direction;

forming access devices over the first conductive lines, the access devices coupled with the first conductive lines and the second conductive lines; and forming storage node structures over and coupled with the access devices.

10. A microelectronic device, comprising:

a lower conductive shielding structure;

a dielectric structure substantially surrounding outer horizontal boundaries of the lower conductive shielding structure;

conductive lines overlying the lower conductive shielding structure and extending in parallel in a first horizontal direction;

fin structures overlying the lower conductive shielding structure and extending in parallel in the first horizontal direction, the fin structures interposed between the conductive lines in a second horizontal direction orthogonal to the first horizontal direction and each comprising:

opposing dielectric end structures; and an additional conductive shielding structure interposed between the opposing dielectric end structures;

dielectric spacer structures interposed between the fin structures and each of the lower conductive shielding structure and the conductive lines; and an additional dielectric structure on the dielectric structure and substantially horizontally surrounding an area occupied by the conductive lines, the fin structures, and the dielectric spacer structures.

11. The microelectronic device of claim 10, wherein the opposing dielectric end structures of the fin structures are integral and continuous with the additional dielectric structure.

12. The microelectronic device of claim 10, wherein upper boundaries of the fin structures are substantially coplanar with upper boundaries of the conductive lines, the dielectric spacer structures, and the additional dielectric structure.

13. The microelectronic device of claim 10, further comprising a conductive structure on upper surfaces of the lower conductive shielding structure and the dielectric structure, the fin structures and the dielectric spacer structures positioned on an upper surface of the conductive structure.

14. The microelectronic device of claim 10, wherein the fin structures individually further comprise a dielectric capping structure on the additional conductive shielding structure.

15. The microelectronic device of claim 10, further comprising:

a base structure underlying each of the lower conductive shielding structure and the dielectric structure; and a control logic region comprising control logic circuitry at least partially vertically interposed between the base structure and each of the lower conductive shielding structure and the dielectric structure.

16. The microelectronic device of claim 15, wherein the control logic circuitry comprises complementary metal-oxide-semiconductor (CMOS) circuitry.

17. The microelectronic device of claim 10, further comprising:

memory cells overlying and in electrical communication with the conductive lines; and additional conductive lines overlying the conductive lines and extending in parallel in the second horizontal direction, the additional conductive lines horizontally neighboring and in electrical communication with the memory cells.

18. The microelectronic device of claim 17, wherein the memory cells each comprise:

a vertical access device on one of the conductive lines; and a storage node structure on the vertical access device.

19. A memory device, comprising:

a conductive shielding structure overlying a base structure;

a first peripheral dielectric structure overlying the base structure and outwardly horizontally neighboring the conductive shielding structure;

a second peripheral dielectric structure on the first peripheral dielectric structure; and a memory array region inwardly horizontally neighboring the second peripheral dielectric structure and comprising:

fin structures overlying the conductive shielding structure and extending in a first horizontal direction, each of the fin structures comprising:

two dielectric end structures projecting from and integral with the second peripheral dielectric structure;

an additional conductive shielding structure horizontally interposed between the two dielectric end structures;

digit lines overlying the conductive shielding structure and extending in the first horizontal direction, the digit lines alternating with the fin structures in a second horizontal direction perpendicular to the first horizontal direction;

dielectric spacer structures horizontally interposed between the digit lines and the fin structures, and vertically interposed between the digit lines and the conductive shielding structure;

access lines overlying the digit lines and extending in parallel in the second horizontal direction; and memory cells overlying the digit lines and in electrical communication with the digit lines and the access lines.

20. The memory device of claim 19, further comprising a control logic region at least partially vertically interposed between the base structure and the conductive shielding structure, the control logic region comprising control logic devices in electrical communication with the memory cells of the memory array region.

21. The memory device of claim 19, wherein the dielectric spacer structures each individually comprise:
   two upper portions horizontally adjacent opposing side surfaces of one of the digit lines; and
   a lower portion underlying and integral with the two upper portions, the lower portion vertically adjacent a bottom surface of the one of the digit lines.

22. The memory device of claim 19, wherein the fin structures further comprise dielectric capping structures on the additional conductive shielding structure, upper surfaces of the dielectric capping structures substantially coplanar with upper surfaces of the two dielectric end structures.

23. The memory device of claim 19, wherein inner horizontal boundaries of the second peripheral dielectric structure are outwardly horizontally offset inner horizontal boundaries of the first peripheral dielectric structure.

24. The memory device of claim 19, wherein each of the memory cells is positioned between two of the access lines in the first horizontal direction and is positioned between two of the fin structures in the second horizontal direction.

25. The memory device of claim 19, wherein each of the memory cells comprises:
   a vertical transistor on an upper surface of one of the digit lines, the vertical transistor comprising:
      a source region;
      a drain region;
      a channel region vertically between the source region and the drain region; and
      a gate horizontally neighboring the channel region comprising a portion of one access lines; and
   a storage node structure on the vertical transistor.

26. An electronic system, comprising:
   an input device;
   an output device;
   a processor device operably connected to the input device and the output device; and
   a memory device operably connected to the processor device and comprising:
      a shielding plate comprising conductive material;
      a peripheral dielectric structure horizontally circumscribing the shielding plate;
      an additional peripheral dielectric structure vertically on the peripheral dielectric structure and having inner horizontal boundaries outwardly offset from inner horizontal boundaries of the peripheral dielectric structure;
      fin structures vertically overlying the shielding plate and extending in parallel in a first horizontal direction, the fin structures each comprising:
         two dielectric end structures horizontally protruding from the additional peripheral dielectric structure; and
         an additional shielding structure comprising additional conductive material extending from and between the two dielectric end structures;
      digit lines horizontally alternating with the fin structures, upper surfaces of the digit lines substantially coplanar with upper surfaces of the fin structures;
      access lines vertically overlying the digit lines and extending in parallel in a second horizontal direction orthogonal to the first horizontal direction; and
      memory cells vertically overlying the digit lines and coupled to the digit lines and the access lines.

27. The electronic system of claim 26, wherein the memory device comprises a dynamic random access memory (DRAM) device.

28. The electronic system of claim 26, further comprising control logic circuitry vertically underlying the shielding plate and the peripheral dielectric structure, the control logic circuitry coupled to the memory cells.

* * * * *

UNITED STATES PATENT AND TRADEMARK OFFICE
CERTIFICATE OF CORRECTION

PATENT NO.       : 11,257,766 B1                                    Page 1 of 1
APPLICATION NO.  : 16/999817
DATED            : February 22, 2022
INVENTOR(S)      : Russell A. Benson et al.

It is certified that error appears in the above-identified patent and that said Letters Patent is hereby corrected as shown below:

In the Specification
Column 11,    Line 17,    change "Sift)." to --$SiO_2$).--

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*